(12) United States Patent
Takabayashi et al.

(10) Patent No.: US 7,940,819 B2
(45) Date of Patent: May 10, 2011

(54) TUNABLE LASER MODULE, TUNABLE LASER APPARATUS AND CONTROLLING METHOD FOR TUNABLE LASER

(75) Inventors: Kazumasa Takabayashi, Kawasaki (JP); Tsutomu Ishikawa, Yamanashi (JP); Hirokazu Tanaka, Yamanashi (JP)

(73) Assignees: Fujitsu Limited, Kawasaki (JP); Eudyna Devices Inc., Yamanashi (JP)

( * ) Notice: Subject to any disclaimer, the term of this patent is extended or adjusted under 35 U.S.C. 154(b) by 84 days.

(21) Appl. No.: 12/535,283

(22) Filed: Aug. 4, 2009

(65) Prior Publication Data

US 2010/0034224 A1     Feb. 11, 2010

(30) Foreign Application Priority Data

Aug. 7, 2008   (JP) ................. 2008-204419

(51) Int. Cl.
*H01S 3/10* (2006.01)
*H01S 3/00* (2006.01)
*H01S 3/13* (2006.01)

(52) U.S. Cl. ............. 372/20; 372/33; 372/29.02

(58) Field of Classification Search ............. 372/20, 372/29.02, 33, 38.01, 102
See application file for complete search history.

(56) References Cited

U.S. PATENT DOCUMENTS

| | | | |
|---|---|---|---|
| 5,325,392 A | 6/1994 | Tohmori et al. | |
| 6,690,688 B2 | 2/2004 | Gotoda | |
| 6,836,489 B2 | 12/2004 | Nishimura et al. | |
| 2003/0007524 A1 | 1/2003 | Gotoda | |
| 2003/0179790 A1 | 9/2003 | Bouda et al. | |
| 2004/0008743 A1 | 1/2004 | Nishimura et al. | |
| 2004/0120721 A1 | 6/2004 | Wang et al. | |
| 2006/0222038 A1 | 10/2006 | Yamazaki | |

FOREIGN PATENT DOCUMENTS

| | | |
|---|---|---|
| JP | 6-61572 A | 3/1994 |
| JP | 6-61577 A | 3/1994 |
| JP | 9-129958 A | 5/1997 |
| JP | 2003-017803 A | 1/2003 |
| JP | 2003-283024 A | 10/2003 |
| JP | 2004-047638 A | 2/2004 |
| JP | 2004-208257 A | 7/2004 |
| JP | 2006-278769 A | 10/2006 |

OTHER PUBLICATIONS

A. S. P. Chang et al., "Tunable Liquid Crystal-Resonant Grating Filter Fabricated by Nanoimprint Lithography", IEEE Photonics Technology Letters, Oct. 1, 2007; vol. 19, No. 19, pp. 1457-1459.

*Primary Examiner* — Armando Rodriguez
(74) *Attorney, Agent, or Firm* — Westerman, Hattori, Daniels & Adrian, LLP

(57) ABSTRACT

A tunable laser module includes a tunable laser section including a gain medium and a wavelength filter having a periodic characteristic which brings about a discontinuous variation of an oscillation wavelength, and a monitoring section adapted to output a monitoring signal which periodically varies in response to the oscillation wavelength of the tunable laser section. The monitoring section includes a monitoring wavelength filter having a periodic characteristic which defines the monitoring signal. The relationship between the period of the wavelength filter and the period of the monitoring wavelength filter is set such that the monitoring signal varies when the oscillation wavelength varies discontinuously.

20 Claims, 22 Drawing Sheets

ONE FILTER

DIFFERENT FILTER

BOTH FILTERS

REFLECTING MIRROR  GAIN MEDIUM  TUNABLE FILTER  PERIODIC FILTER  REFLECTING MIRROR

PERIODIC FILTER

TUNABLE FILTER

BOTH FILTERS

US 7,940,819 B2

TUNABLE LASER MODULE, TUNABLE LASER APPARATUS AND CONTROLLING METHOD FOR TUNABLE LASER

CROSS-REFERENCE TO RELATED APPLICATIONS

This application is based upon and claims the benefit of priority of the prior Japanese Patent Application No. 2008-204419 filed on Aug. 7, 2008, the entire contents of which are incorporated herein by reference.

FIELD

The embodiments discussed herein are related to a tunable laser module, a tunable laser apparatus which include a tunable laser and a controlling method for a tunable laser.

BACKGROUND

Together with drastic increase of communication demand in recent years, development of a wavelength division multiplexing communication system (WDM system) wherein a plurality of signal lights having wavelengths different from each other are multiplexed so that high capacity transmission may be implemented with one optical fiber is advancing.

In such a wavelength division multiplexing communication system as just described, a tunable laser capable of selecting a desired wavelength at a high speed over a wide wavelength range is needed in order to implement a flexible and an advanced communication system.

In a wavelength division multiplexing (WDM) optical communication system, communication with a high capacity can be implemented by transmitting optical signals having wavelengths different from each other within a wavelength range of the C-band (1,525 to 1,565 nm) or the L-band (1,570 to 1,610 nm) through one optical fiber.

In the WDM communication system, from an aspect of inventory control of a laser to be used as a light source, flexibility of system construction and so forth, a tunable laser which can output light with an arbitrary wavelength in the C-band or the L-band described above, that is, which has a tunable width (a wavelength variable width) of approximately 40 nm, is needed.

For example, there is a tunable laser wherein two wavelength filters having periodic peak wavelengths different from each other are disposed in a cavity and the oscillation wavelength is varied by utilizing a vernier effect (hereinafter referred to as first technique).

For example, also there is a tunable laser wherein a wavelength filter having a periodic peak wavelength such as an etalon and a tunable filter capable of varying the transmission wavelength or the reflection wavelength over a wide band are disposed in a cavity and the oscillation wavelength is varied by selecting one of peak wavelengths of the wavelength filter such as an etalon using the tunable filter (hereinafter referred to as second technique).

SUMMARY

According to an aspect of the embodiment, a tunable laser module includes a tunable laser section including a gain medium and a wavelength filter having a periodic characteristic which brings about a discontinuous variation of an oscillation wavelength, and a monitoring section adapted to output a monitoring signal which periodically varies in response to the oscillation wavelength of the tunable laser section, and wherein the monitoring section includes a monitoring wavelength filter having a periodic characteristic which defines the monitoring signal, and a relationship between the period of the wavelength filter and the period of the monitoring wavelength filter is set such that the monitoring signal varies when the oscillation wavelength varies discontinuously.

According to another aspect of the embodiment, a tunable laser apparatus includes the tunable laser module described above, and a controller adapted to control the tunable laser section based on the monitoring signal from the monitoring section.

According to a further aspect of the embodiment, a controlling method for a tunable laser includes varying an oscillation wavelength of a tunable laser including a wavelength filter having a periodic characteristic which brings about a discontinuous variation of the oscillation wavelength, detecting a discontinuous point of a monitoring signal obtained in response to the oscillation wavelength of the tunable laser through a monitoring wavelength filter set such that, when the oscillation wavelength varies discontinuously in relation with the period of the wavelength filter, the monitoring signal varies, and setting an operating point of the tunable laser based on the discontinuous point of the monitoring signal.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 2A illustrates the transmission characteristic of a first etalon, FIG. 2B illustrates the transmission characteristic of a second etalon and FIG. 2C illustrates the transmission characteristic of an external etalon;

FIG. 6A illustrates variation of the oscillation wavelength where the temperature of the second etalon is varied and FIG. 6B illustrates variation of the oscillation wavelength where the temperature of the first etalon is varied;

FIG. 8A illustrates the variation of the locker signal in a case wherein the oscillation wavelength hops to the longer wavelength side and FIG. 8B illustrates the variation of the locker signal in another case wherein the oscillation wavelength hops to the shorter wavelength side, while FIG. 8C illustrates variation of the locker signal in a case wherein the oscillation wavelength hops to the longer wavelength side and FIG. 8D illustrates variation of the locker signal in another case wherein the oscillation wavelength hops to the shorter wavelength side;

FIG. 10A illustrates a configuration of the tunable laser section, FIG. 10B illustrates a transmission characteristic of one wavelength filter, FIG. 10C illustrates a transmission characteristic of a different filter and FIG. 10D illustrates a transmission characteristic in a state wherein the oscillation wavelength is selected by both of the filters;

FIG. 11A illustrates a configuration of a wavelength filter for which an SG-DBR is used and FIG. 11B illustrates a configuration of a wavelength filter for which an SSG-DBR is used;

FIG. 12 illustrates a configuration of a wavelength filter for which a ring resonator is used;

FIG. 19A illustrates a transmission characteristic of an internal etalon, FIG. 19B illustrates a transmission characteristic of a tunable filter and FIG. 19C illustrates a transmission characteristic of an external etalon;

FIG. 21A shows a configuration of the tunable laser section, FIG. 21B illustrates a periodic transmission characteristic of a wavelength filter, FIG. 21C illustrates a transmission characteristic of the tunable filter and FIG. 21D illustrates a periodic transmission characteristic in a state wherein the oscillation wavelength is selected by both of the filters.

DESCRIPTION OF EMBODIMENTS

Figure 1:
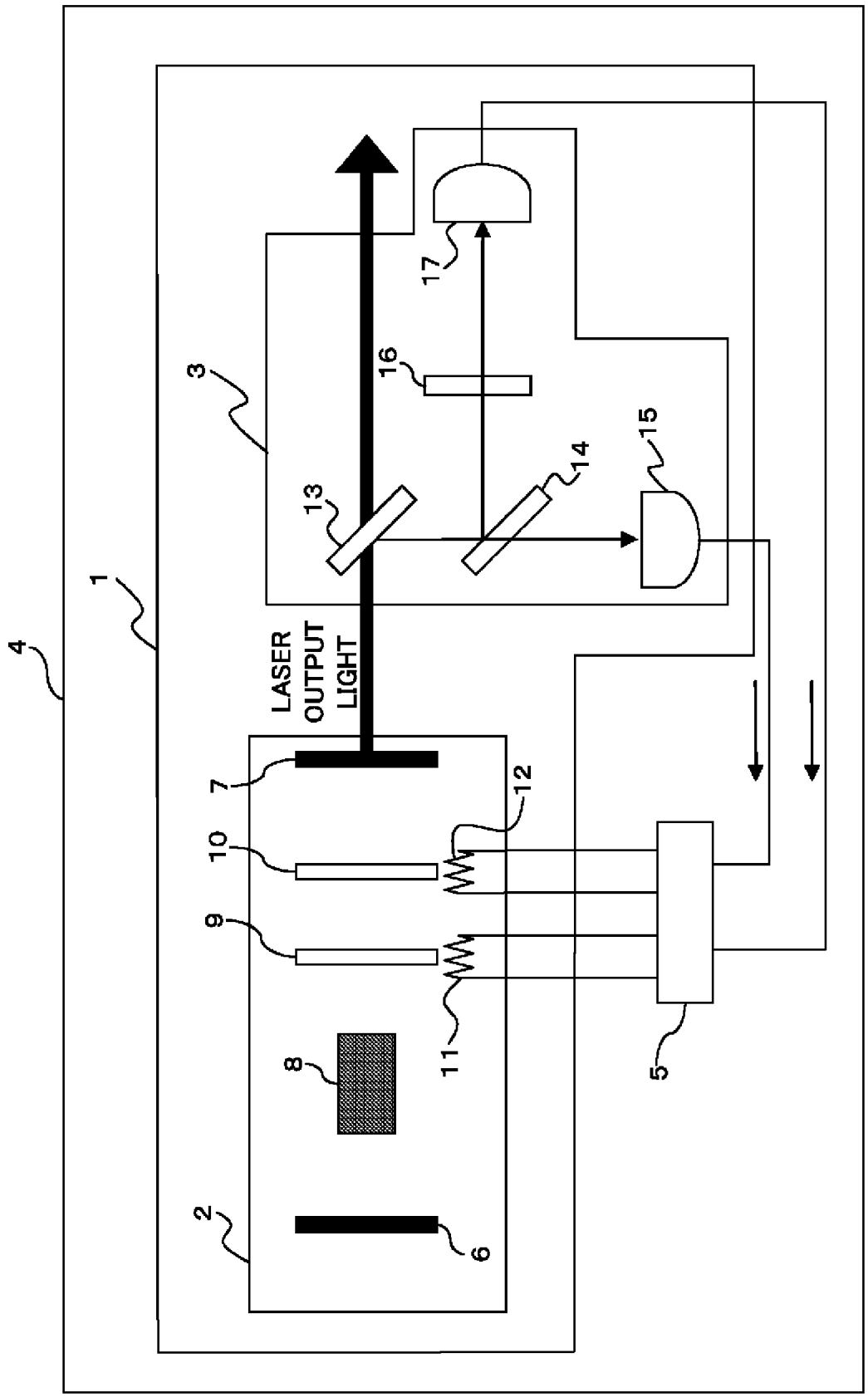
FIG. 1 is a schematic view illustrating a configuration of a tunable laser module according to a first embodiment.

With the tunable lasers according to the first and second techniques described hereinabove, discontinuous wavelength variation occurs in principle.

For example, in the tunable laser according to the first technique described above, if a peak wavelength of a first wavelength filter having one periodic peak wavelength is fixed and a peak wavelength of a second wavelength filter having another periodic peak wavelength is varied, then the oscillation wavelength varies discontinuously at wavelength intervals corresponding to the interval between peak wavelengths of the first wavelength filter.

On the other hand, for example, also in the tunable laser according to the second technique described above, if the transmission wavelength or the reflection wavelength of the tunable filter is varied, then the oscillation wavelength varies discontinuously at wavelength intervals corresponding to the interval between peak values of a wavelength filter such as an etalon.

At a discontinuous point at which the oscillation wavelength varies discontinuously in this manner, the laser oscillation becomes unstable in that oscillation occurs in a plurality of wavelengths or the like.

Therefore, in order to obtain stable single mode oscillation which is demanded for a light source for optical communication, it is necessary to cause the tunable laser to operate avoiding such discontinuous points.

In this instance, it seems a possible countermeasure to set the operating point of the tunable laser upon fabrication or the like in advance such that it avoids discontinuous points and points in the proximity of the discontinuous points. However, in the lasers, generally, there is time degradation of a device characteristic. As this proceeds, the position of a discontinuous point at which the oscillation wavelength varies discontinuously varies. As a result, there is the possibility that the operating point set in advance may be displaced from an optimum operating point as time degradation proceeds but may be positioned at a discontinuous point or a point in the proximity of a discontinuous point.

Therefore, it is desirable to detect a discontinuous point at which the oscillation wavelength varies discontinuously without complicating the configuration of a tunable laser module and make it possible to set and update an operating point with certainty while avoiding the discontinuous point and a point in the proximity of the discontinuous point thereby to implement stabilized single mode oscillation.

In the following, a tunable laser module, a tunable laser apparatus and a controlling method for a tunable laser according to embodiments are described below with reference to the drawings.

A tunable lased module and a tunable laser apparatus include a tunable laser used, for example, as a light source for optical communication and capable of varying the oscillation wavelength of the light source over a wide range.

A controlling method for a tunable laser is a controlling method for a tunable laser used, for example, as a light source for optical communication and capable of varying the oscillation wavelength of the light source over a wide range.

First Embodiment

First, a tunable laser module, a tunable laser apparatus and a controlling method for a tunable laser according to a first embodiment are described with reference to FIGS. 1 to 12.

Figure 10A:
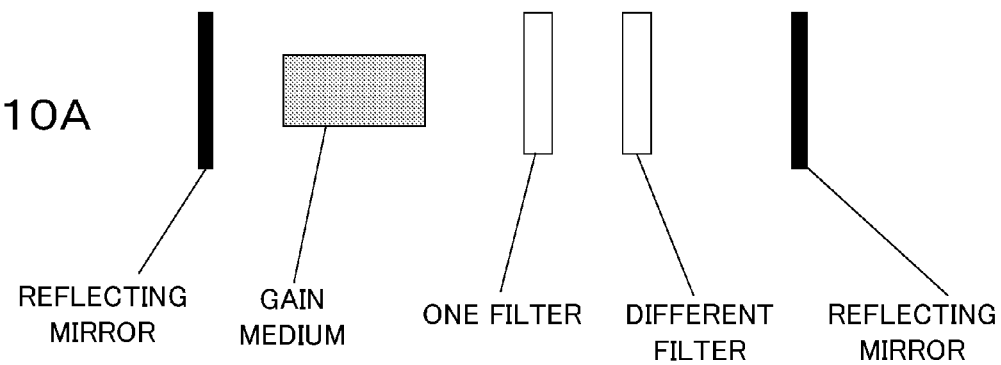
FIGS. 10A to 10D are views illustrating selection of an oscillation wavelength in the tunable laser section provided in the tunable laser module according to the first embodiment, and particularly.
Figure 10B:
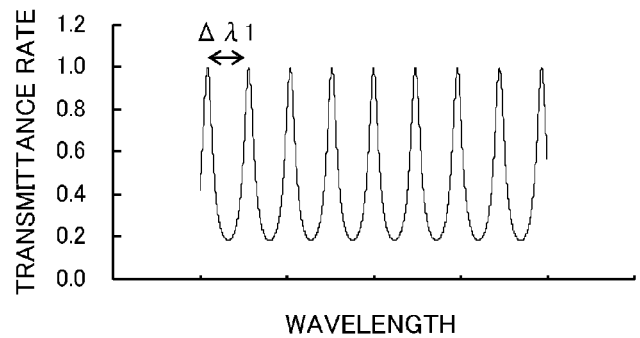
Figure 10C:
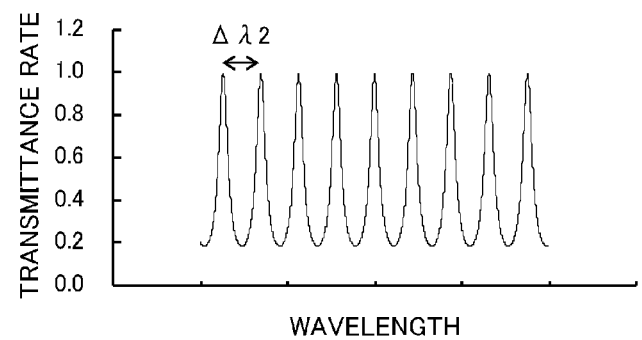

The tunable laser module according to the present embodiment includes a gain medium and two wavelength filters [refer to FIGS. 10B and 10C] having periodic peak wavelengths different from each other, provided in a cavity configured from two reflecting mirrors. The tunable laser module further includes a tunable laser [refer to FIG. 10A] for varying the oscillation wavelength utilizing the vernier effect.

Figure 10D:
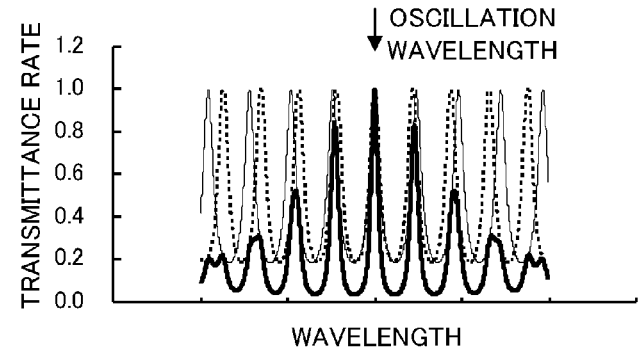

In such a tunable laser as described above, laser oscillation occurs in a wavelength with which the position of a peak wavelength of one of the wavelength filters and the position of a peak wavelength of the other one of the wavelength filters coincide with each other [refer to FIG. 10D]. Further, by continuously varying the position of the peak wavelength of the other wavelength filter with respect to the position of the peak wavelength of the one wavelength filter, the oscillation wavelength can be discontinuously varied at wavelength intervals corresponding to the interval [indicated by $\Delta\lambda 1$ or $\Delta\lambda 2$ in FIG. 10B or 10C] between peak wavelengths of the one wavelength filter. In particular, by varying a filter characteristic (by continuously varying a wavelength controlling parameter), the oscillation wavelength can be discontinuously varied at specific wavelength intervals.

In particular, as illustrated in FIG. 1, the present tunable laser module 1 includes a tunable laser section 2 whose oscillation wavelength varies discontinuously at specific wavelength intervals where the wavelength controlling parameter (here, temperature) is swept (continuously varied), and a wavelength locker 3 used to control the oscillation wavelength.

Further, as illustrated in FIG. 1, a tunable laser apparatus 4 according to the present embodiment includes the tunable laser module 1, a controller (controlling system; including a driver circuit) 5 for controlling the tunable laser section 2 based on a signal (output signal; detection signal) from the wavelength locker 3. Then, the controller 5 carries out feedback control based on the signal from the wavelength locker 3 so that the oscillation wavelength is controlled to a desired oscillation wavelength.

Here, as illustrated in FIG. 1, the tunable laser section 2 is configured such that a semiconductor optical amplifier (SOA; Semiconductor Optical Amplifier) 8 which is a gain medium and two wavelength filters (here, Fabry-Perot etalon filters; hereinafter referred to simply as etalons) 9 and 10 each having a periodic peak wavelength are disposed in a cavity which is configured from two reflecting mirrors 6 and 7.

Figure 2A:
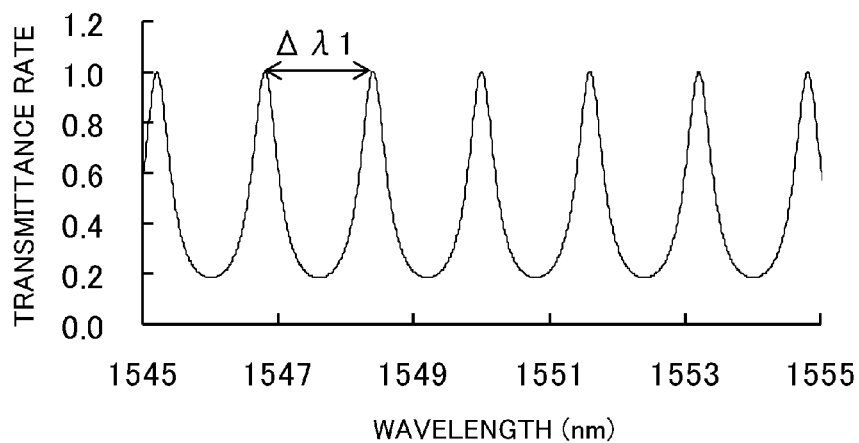
FIGS. 2A to 2C are views illustrating transmission characteristics of filters provided in the tunable laser module according to the first embodiment, and particularly.
Figure 2B:
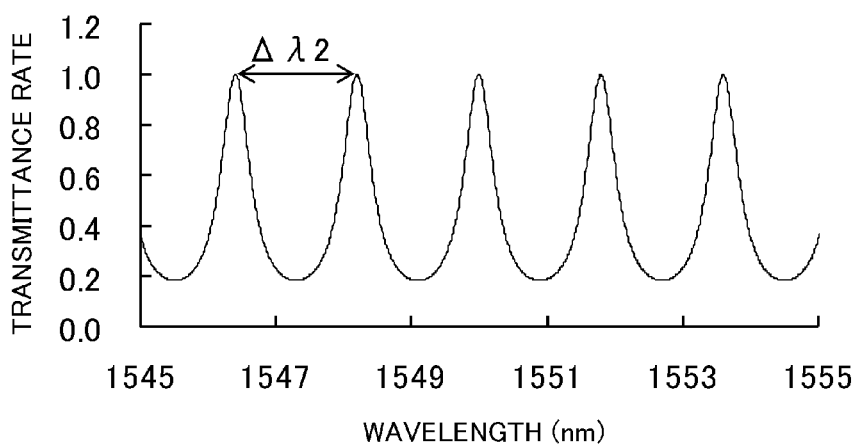

Here, the first wavelength filter (first etalon) 9 and the second wavelength filter (second etalon) 10 provided in the inside of the laser cavity are each formed from a thin plate made of silicon (Si), and have different periods (different periodic peak wavelengths) $\Delta\lambda 1$ and $\Delta\lambda 2$ from each other as seen in FIGS. 2A and 2B, respectively.

In the present embodiment, the thicknesses of the first etalon 9 and the second etalon 10 are individually adjusted such that the periods of transmission peak wavelengths (free spectral ranges; FSR) $\Delta\lambda 1$ and $\Delta\lambda 2$ are 1.6 nm (200 GHz expressed in terms of the frequency) and 1.8 nm (225 GHz expressed in terms of the frequency), respectively. It is to be noted that the periods of the first etalon 9 and the second etalon 10 (periods of the peak wavelengths; FSR) are not limited to them.

Further, as illustrated in FIG. 1, the temperatures (wavelength controlling parameters) of the first etalon 9 and the second etalon 10 are controlled individually and independently of each other by the controller 5 such that the positions of peak wavelengths can be varied individually and independently of each other by the temperature control. Therefore, a first heater (first wavelength controlling device; temperature adjustment mechanism) 11 for controlling the temperature is provided for the first etalon 9. Similarly, a second heater (second wavelength controlling device; temperature adjustment mechanism) 12 for controlling the temperature is provided also for the second etalon 10. The first and second heaters 11 and 12 are controlled independently of each other based on a wavelength controlling signal from the controller 5.

Then, in the present embodiment, the oscillation wavelength is selected using the first etalon 9 and the second etalon 10 and utilizing the vernier effect and the oscillation wavelength is adjusted so as to comply with the ITU (International Telecommunications Union)-T standard (ITU-T grid). In particular, the temperatures of the first and second etalons 9 and 10 are adjusted and the positions of peak wavelengths of the etalons are varied so that the peaks overlapping with each other between the two etalons are selected and the overlapping peaks are adjusted so as to comply with the ITU-T grid.

Further, for at least one of the two reflecting mirrors 6 and 7, a mechanism capable of varying the position of the reflecting mirror is provided. By varying the position of the reflecting mirror 6 (or 7) by the controller 5, the cavity longitudinal-mode position can be controlled. Consequently, oscillation mode hopping between cavity longitudinal modes is suppressed.

In the present embodiment, by usually feedback controlling the longitudinal-mode position, oscillation usually occurs at the center wavelength of a peak determined by the vernier effect of the first and second etalons 9 and 10.

Here, as a particular controlling method for the longitudinal-mode position, for example, a method wherein a piezoelectric element(device) is mounted on the reflecting mirror 6 (or 7) which configures the cavity and the position of the reflecting mirror 6 (or 7) is finely adjusted and controlled by applying a voltage to the piezoelectric element, another method wherein a phase controlling waveguide (waveguide being transparent for laser light) is integrated with the semiconductor optical amplifier 8 which is a gain medium and the phase is controlled by injecting current to the phase controlling waveguide, and like methods are available.

Incidentally, as illustrated in FIG. 1, the wavelength locker 3 is provided externally of the laser cavity, and includes a first beam splitter 13 for branching part of output light from the tunable laser section 2, a second beam splitter 14 for branching the branched light into two lights, a first optical detector (power monitor) 15 for detecting the intensity of one of the lights branched by the second beam splitter 14, a wavelength filter (external wavelength filter; locker wavelength filter) 16 disposed on an optical axis of the other one of the lights branched by the second beam splitter 14, and a second optical detector (power monitor) 17 for detecting the intensity of light passing through the wavelength filter 16.

Here, the wavelength filter 16 is a wavelength filter (transmission type wavelength filter) having a transmittance (transmission rate; transmission characteristic; transmission spectrum; intensity characteristic) which periodically varies with respect to the wavelength within a driving wavelength range of the tunable laser section 2. It is to be noted that the wavelength filter 16 may have a wavelength-intensity characteristic which periodically varies with respect to an input wavelength, and, for example, a reflection type wavelength filter may be used as the wavelength filter 16.

In the present embodiment, as the wavelength filter 16, a Fabry-Perot etalon filter (external etalon; wavelength locker etalon) having a periodic transmission peak wavelength is used.

Figure 2C:
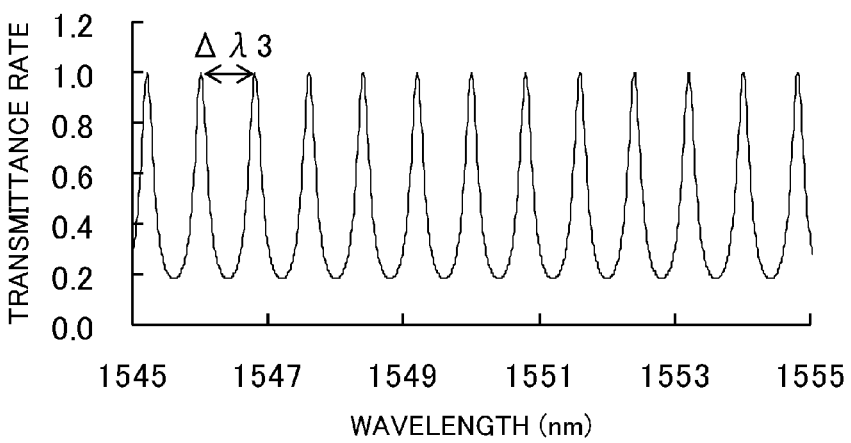
Figure 3:
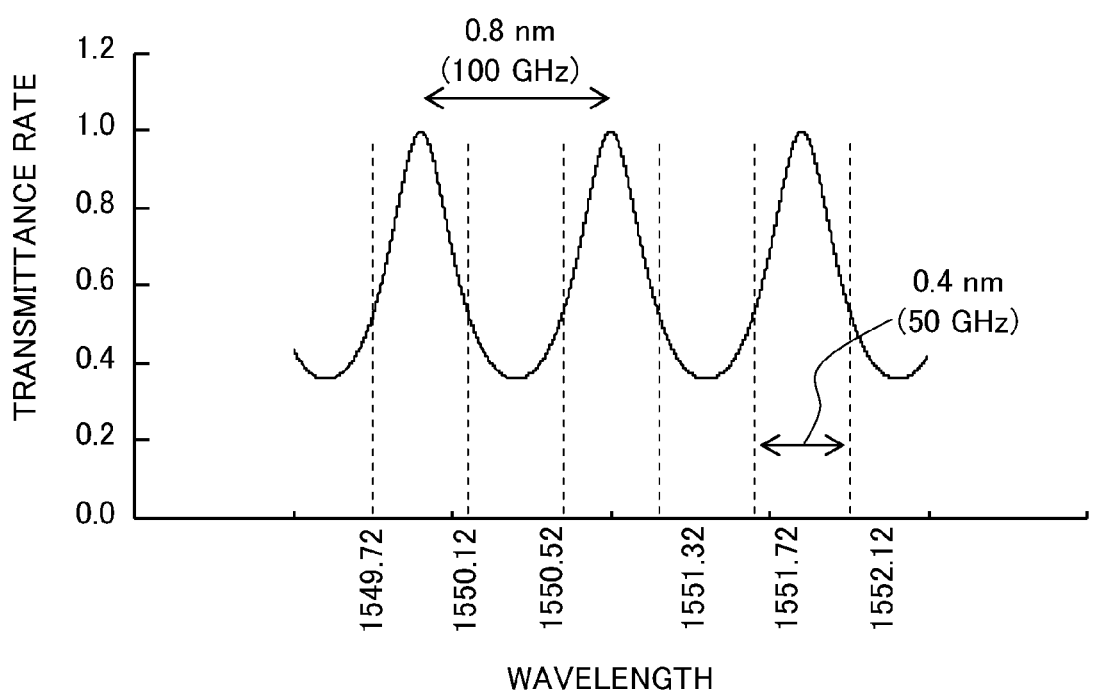
FIG. 3 is a view illustrating a relationship between the ITU-T grid and the transmission characteristic of the external etalon in a wavelength locker provided in the tunable laser module according to the first embodiment.

The external etalon 16 is configured, for example, from a quartz (silica) plate, and, as illustrated in FIGS. 2C and 3, the thickness of the etalon 16 is adjusted so that the period (FSR) $\Delta\lambda 3$ of the transmission peak wavelength is 0.8 nm (100 GHz expressed in terms of the frequency).

Further, as illustrated in FIG. 3, a transmission peak wavelength and a transmission bottom wavelength of the external etalon 16 are set so as to be positioned, for example, midway of an ITU-T grid of an interval of 0.4 nm (50 GHz expressed in terms of the frequency). In particular, for example, in the case of a tunable laser capable of oscillating with an ITU-T grid of a 50-GHz interval, an external etalon having a peak wavelength of a 100-GHz interval is used such that the ITU-T grid is positioned in the proximity of a middle point between a transmission peak wavelength and a transmission bottom wavelength of the external etalon.

It is to be noted that the period of the external etalon 16 (period of peak wavelength; FSR) is not limited to this, and, for example, it is preferable to set the period to a value of an integral multiple of 12.5 GHz, 25 GHz, 50 GHz or 100 GHz where the period is converted into a frequency. In particular, it is preferable to set the interval between peak wavelengths of the external etalon 16 so as to comply with the ITU-T grid.

Then, in the present embodiment, the controller 5 reads an output signal from the first optical detector 15 and an output signal from the second optical detector 17 and divides the output signal (output value) of the first optical detector 15 into the output signal (output value) of the second optical detector 17 to determine an output signal (wavelength locker signal; refer to FIG. 4) from the wavelength locker 3. The wavelength locker signal is determined in response to a transmittance (transmission intensity) which varies in response to the wavelength of the external etalon 16. Therefore, the external etalon 16 has a periodic characteristic for defining the wavelength locker signal.

Figure 4:
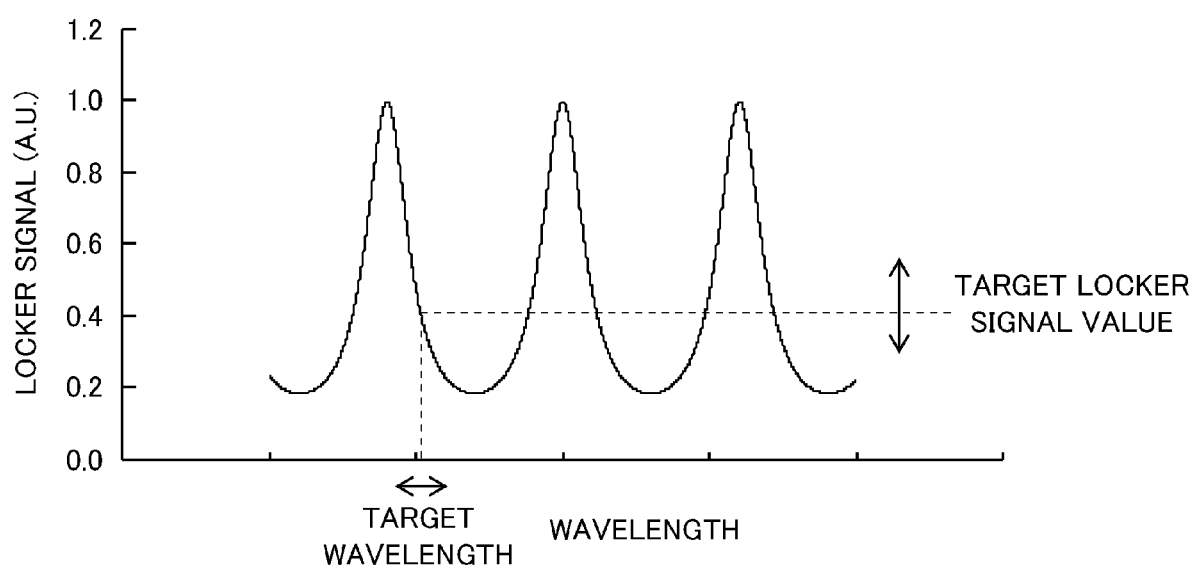
FIG. 4 is a view illustrating a locker signal from the wavelength locker provided in the tunable laser module according to the first embodiment.

Further, the controller 5 carries out feedback control of the temperatures of the first and second etalons 9 and 10 to control the oscillation wavelength to a target wavelength so that the value of the wavelength locker signal calculated as described above becomes equal to a target locker signal value (that is, the ratio between the output value from the first optical detector 15 and the output value from the second optical detector 17 becomes equal to a target value) (refer to FIG. 4).

Particularly, by adjusting the relationship between the ITU-T grid and the period of the peak wavelength of the external etalon so that the ITU-T grid is positioned in the proximity of a slope in which the transmittance of the external etalon 16 varies by a comparatively great amount, it is possible to cause the transmittance of the external etalon 16, that is, the wavelength locker signal obtained based on the output value of the wavelength locker 3, to vary by a great amount where the oscillation wavelength is displaced from the ITU-T grid. Further, by controlling the oscillation wavelength based on the variation of the wavelength locker signal, it is possible to adjust the oscillation wavelength to the ITU-T grid wavelength with high accuracy.

Incidentally, in such a tunable laser section 2 for which the vernier effect is used as described above, the oscillation wavelength can be selected, for example, by fixing the position of a peak wavelength of the first etalon 9 and adjusting the temperature of the second etalon 10 to vary the position of the peak wavelength of the second etalon 10.

Figure 6A:
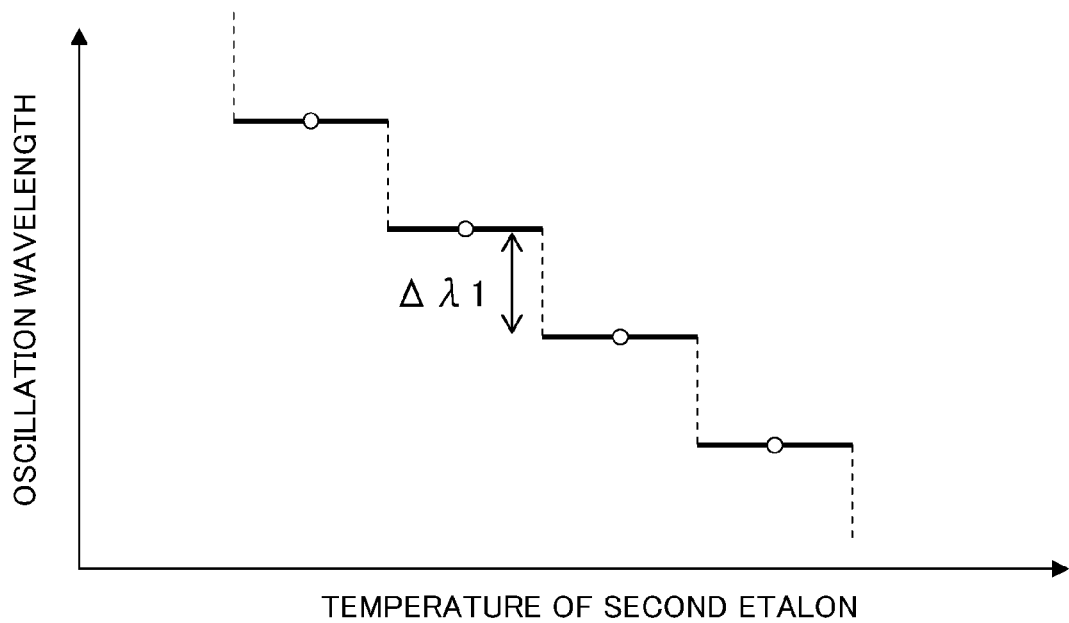
FIGS. 6A and 6B are views illustrating variation of the oscillation wavelength of laser light outputted from the tunable laser section provided in the tunable laser module according to the first embodiment, and particularly.

In this instance, if the temperature of the first etalon 9 is fixed and the temperature of the second etalon 10 is raised (the wavelength controlling parameter is continuously varied) and then the position of the peak wavelength of the second etalon 10 is successively shifted to the longer wavelength side, then the oscillation wavelength varies stepwise to the shorter wavelength side and discontinuous variation of the oscillation wavelength occurs at wavelength intervals (wavelength variation width) corresponding to the interval (period) $\Delta\lambda 1$ between peak wavelengths of the first etalon 9 as illustrated in FIG. 6A.

On the contrary, also it is possible to select an oscillation wavelength by fixing the position of a peak wavelength of the second etalon 10 and adjusting the temperature of the first etalon 9 to vary the position of the peak wavelength of the first etalon 9.

Figure 6B:
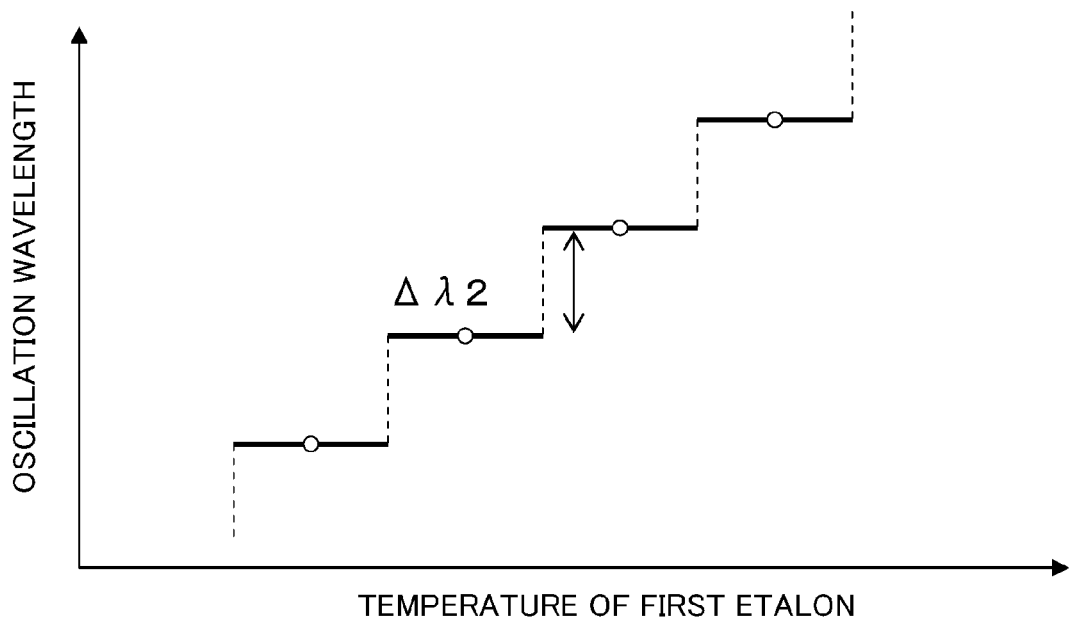

In this instance, if the temperature of the second etalon 10 is fixed and the temperature of the first etalon 9 is raised (the wavelength controlling parameter is continuously varied) and then the position of the peak wavelength of the first etalon 9 is successively shifted to the longer wavelength side, then the oscillation wavelength varies stepwise to the longer wavelength side and discontinuous variation of the oscillation wavelength occurs at wavelength intervals (wavelength variation widths) corresponding to the interval (period) $\Delta\lambda 2$ of the peak wavelength of the second etalon 10 as illustrated in FIG. 6B.

In such a tunable laser section 2 as described above, in order to obtain stabilized single-mode oscillation, it is necessary to set the operating point so as to avoid a discontinuous point at which the oscillation wavelength varies discontinuously or around the discontinuous point.

Figure 5:
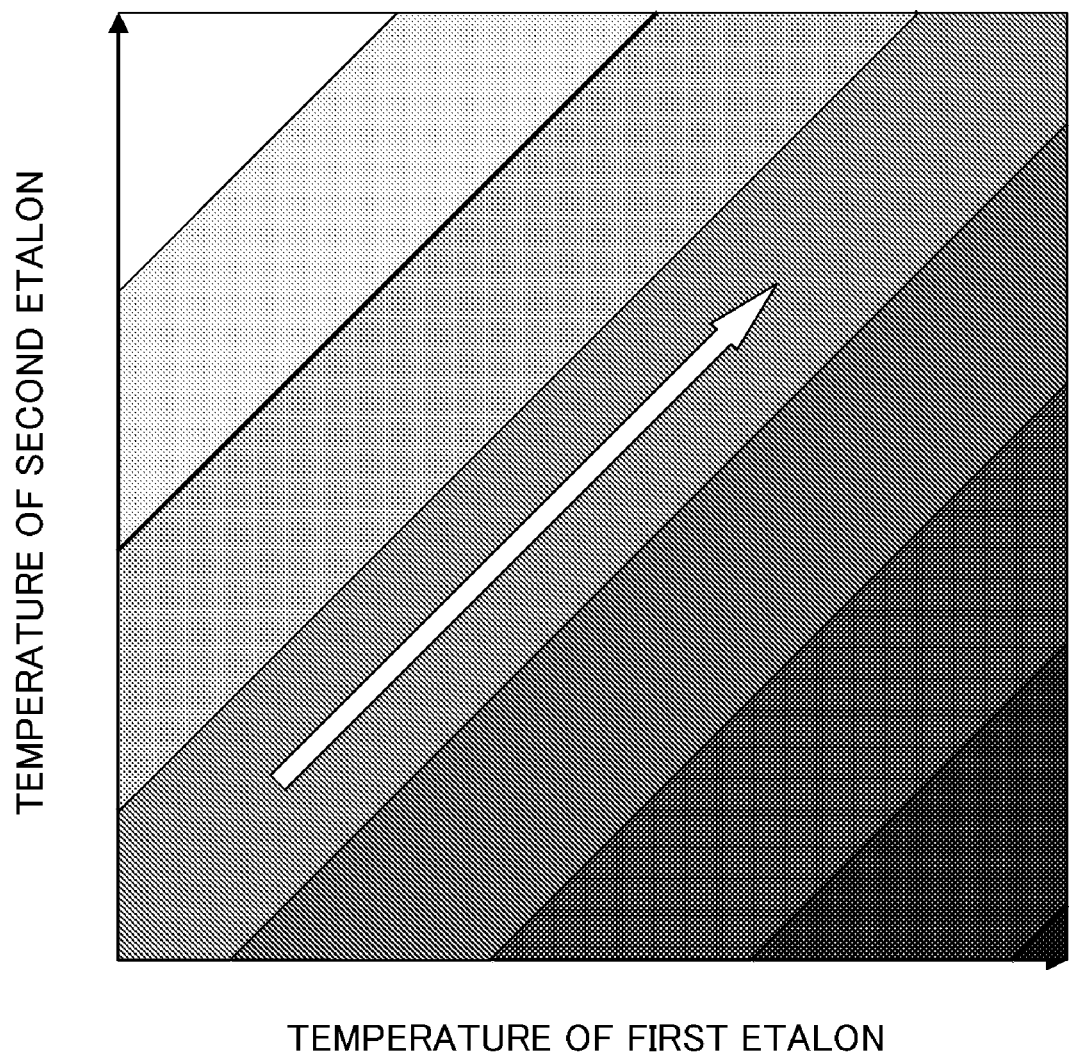
FIG. 5 is a map illustrating a relationship between the oscillation wavelength and the temperatures of the first and second etalons in a tunable laser section provided in the tunable laser module according to the first embodiment.

Upon initialization of the operating point (for example, upon fabrication), for example, such a map as illustrated in FIG. 5, that is, a map which illustrates variation of the oscillation wavelength with respect to the temperature of the first and second etalons 9 and 10, is used. It is to be noted that, in FIG. 5, the oscillation wavelength becomes a longer wavelength as the density of patterns increases. Further, a boundary across which the density of patterns varies indicates a discontinuous point (point at which the peak wavelengths of the etalons which coincide with each other by the vernier effect vary and consequently the oscillation wavelength varies discontinuously).

For example, if the temperature of the first etalon 9 is fixed and the temperature of the second etalon 10 is raised (the refractive index of the second etalon 10 is increased), then the oscillation wavelength varies discontinuously to the shorter wavelength side as illustrated in FIG. 5.

On the contrary, for example, if the temperature of the second etalon 10 is fixed and the temperature of the first etalon 9 is raised (the refractive index of the first etalon 9 is increased), then the oscillation wavelength varies discontinuously to the longer wavelength side as shown in FIG. 5.

Further, by varying the temperatures of the first and second etalons 9 and 10 similarly to each other within a region between adjacent boundary lines across which the density of patterns varies in FIG. 5, the peak wavelengths of both of the etalons 9 and 10 can be moved similarly to each other. Therefore, the oscillation wavelength can be continuously varied without causing wavelength hopping between peak wavelengths of the etalons.

Therefore, in the present embodiment, the peak wavelength positions of the first and second etalons 9 and 10 are relatively varied first to make the peak wavelengths of the first and second etalons 9 and 10 in the proximity of a desired wavelength coincide with each other to select an oscillation wavelength. Then, the temperatures of the first and second etalons 9 and 10 are varied similarly to each other and the oscillation wavelength is varied while the peak wavelengths of the first and second etalons 9 and 10 are kept coincident with each other so that the oscillation wavelength is adjusted to a desired ITU grid wavelength.

It is to be noted here that, while the peak wavelength positions of the first and second etalons 9 and 10 are first made coincide with each other to select an oscillation wavelength and then the oscillation wavelength is adjusted to the ITU-T grid wavelength, the present invention is not limited to this. For example, the peak wavelength of the first etalon 9 may be adjusted to a desired ITU-T grid wavelength, whereafter the peak wavelength of the second etalon 10 is adjusted to the peak wavelength of the first etalon 9 to select an oscillation wavelength. Or, the peak wavelength of the second etalon 10 may be adjusted to a desired ITU-T grid wavelength, whereafter the peak wavelength of the first etalon 9 is adjusted to the peak wavelength of the second etalon 10 to select an oscillation wavelength.

Particularly, in the present embodiment, when an oscillation wavelength is selected and then is adjusted to a desired ITU-T grid wavelength as described above, the temperatures of the first and second etalons 9 and 10 are set to an intermediate position between boundary lines at which the density of patterns varies (to a position most spaced from a discontinuous point at which the oscillation wavelength varies discontinuously) and then the temperatures of the first and second etalons 9 and 10 are varied along the intermediate position as indicated by an arrow mark in FIG. 5.

To this end, the temperatures (wavelength controlling parameter) of the first and second etalons 9 and 10 for obtaining any of the plural oscillation wavelengths which discontinuously vary are set to an intermediate position between boundary lines. The setting of the temperatures just described is equivalent to setting of an operating point at a center point of a terrace of stepwise wavelength variation in FIGS. 6A and 6B. Here, in order to set the temperatures (wavelength controlling parameter) of the first and second etalons 9 and 10 as described above, the plural oscillation wavelengths and controlling values (wavelength controlling signal values) to be outputted from the controller 5 to the first and second etalons 9 and 10 are stored in an associated relationship with each other as initial setting values in a table.

Figure 7:
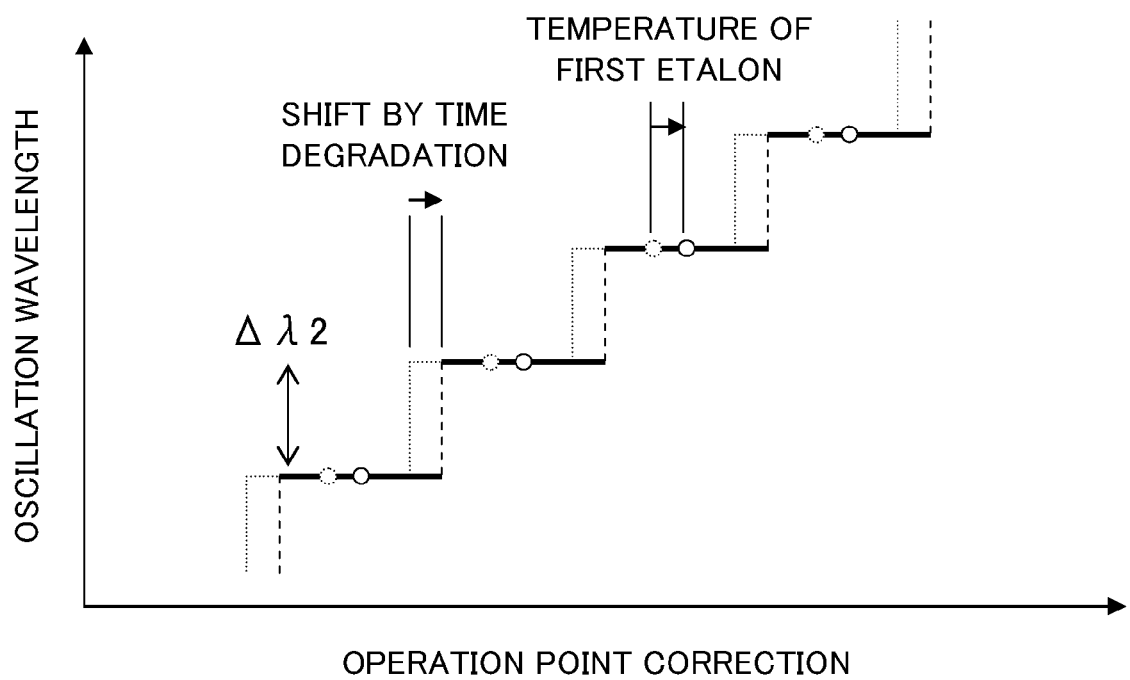
FIG. 7 is a view illustrating that the relationship of the oscillation wavelength and the temperature of the first etalon of the tunable laser section provided in the tunable laser module according to the first embodiment is varied by time degradation.

However, there is the possibility that an operating point initially set in such a manner as described above may be displaced by time degradation of the laser and approach a discontinuous point until it is displaced from an optimum operating point. For example, where the temperature of the first etalon 9 is varied to carry out selection of an oscillation wavelength, there is the possibility that the relationship between the temperature of the first etalon 9 and the oscillation wavelength may shift in a transverse direction by time degradation of the laser as illustrated in FIG. 7. By this shifting, the operating point of the first etalon 9 set initially is displaced from a middle position between two wavelength discontinuous points and hence from an optimum operating point. In this instance, it is necessary to correct the operating point to an intermediate position spaced most from the discontinuous points to update the operating point to an optimum operating point.

Where such correction (updating) of the operating point as described above is carried out, it is necessary to detect a discontinuous point (discontinuous point after time degradation) at which the oscillation wavelength varies discontinuously.

On the other hand, while it is a possible idea to incorporate a wavemeter into the tunable laser module 1, this makes the configuration of the module complicated and actually it is difficult to incorporate a wavemeter. Therefore, it is difficult to directly measure the wavelength. Further, it is impractical to detect a discontinuous point of the oscillation wavelength using an external wavemeter.

Therefore, in the present embodiment, the wavelength locker 3 incorporated in the tunable laser module 1 is used as a monitoring section for monitoring the oscillation wavelength of the tunable laser section 2 and a discontinuous point of the oscillation wavelength is detected from a discontinuous point of the signal intensity of a wavelength locker signal (monitoring signal; a monitoring signal which periodically varies in response to the oscillation wavelength) obtained based on an output signal (monitoring signal) from the wavelength locker 3 to set (update) the operating point.

It is to be noted that, where the wavelength locker 3 is used as a monitoring section, the monitoring section includes a monitoring wavelength filter (external etalon) 16 having a periodic characteristic for defining the monitoring signal (wavelength locker signal), a first optical detector 15 for detecting the light intensity of part of the output light from the tunable laser section 2 as it is, and a second optical detector 17 for detecting the intensity of light which is part of the output light from the tunable laser section 2 and passes through the monitoring wavelength filter 16 (that is, for detecting the output light from the tunable laser section 2 selected by the monitoring wavelength filter 16).

Here, the wavelength locker signal (monitoring signal) obtained based on the output signal (monitoring signal) from the wavelength locker 3 depends upon the transmittance of the external etalon 16 with respect to a wavelength, and, if the oscillation wavelength continuously varies, then also the signal intensity of the oscillation wavelength continuously varies. On the contrary, if the signal intensity varies discontinuously, then the oscillation wavelength varies discontinuously.

Therefore, if a point at which the signal intensity varies discontinuously is detected, then a point at which the oscillation wavelength varies discontinuously can be detected.

However, since usually the signal intensity does not necessarily vary discontinuously at all wavelength discontinuous points and the signal intensity does not sometimes vary, there is the possibility that detection of a wavelength discontinuous point may result in failure.

Figure 8A:
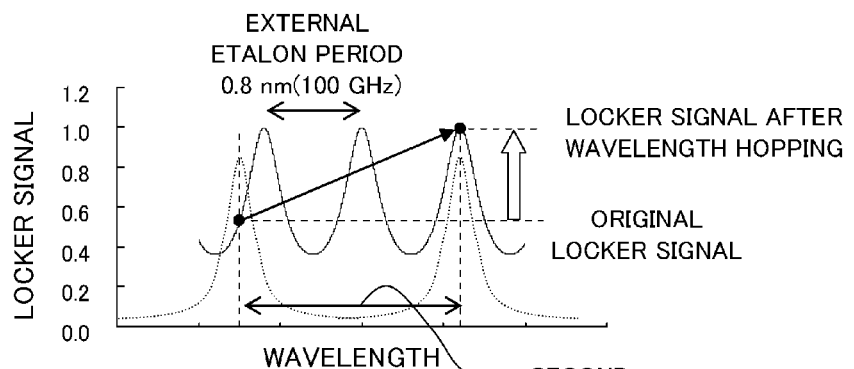
FIGS. 8A and 8B are views illustrating variation of the locker signal where discontinuous variation of the oscillation wavelength occurs in the tunable laser module according to the first embodiment, and particularly.

Here, FIG. 8A illustrates a manner of variation of a wavelength locker signal in a case wherein, where the period of the external etalon 16 is set to 0.8 nm and the period of the second etalon 10 is set to 1.8 nm which is 2.25 times the period of the external etalon 16, only the temperature of the first etalon 9 is varied and the oscillation wavelength hops to the longer wavelength side.

Figure 8B:
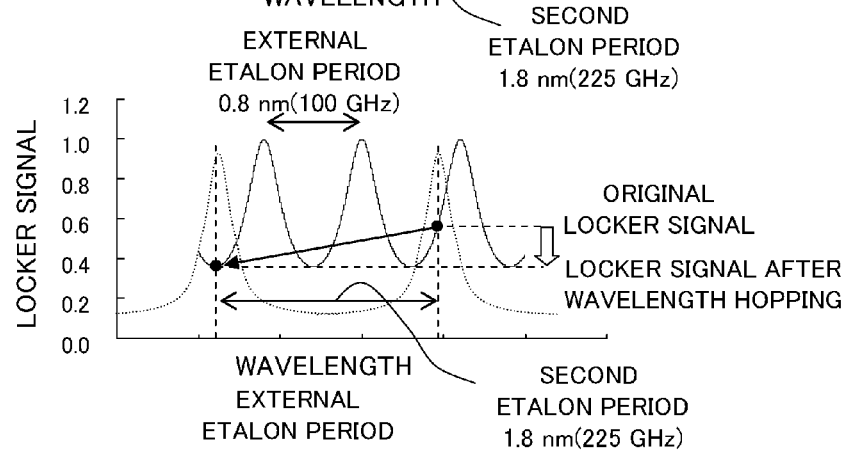

FIG. 8B illustrates a manner of variation of the wavelength locker signal when the temperature only of the first etalon 9 is varied and the oscillation frequency hops to the shorter wavelength side where the period of the external etalon 16 is set to 0.8 nm and the period of the second etalon 10 is set to 1.8 nm which is equal to 2.25 times the period of the external etalon 16 as described above.

Figure 8C:
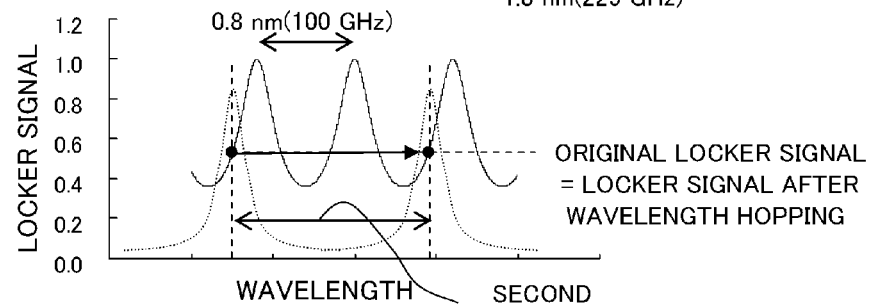
FIGS. 8C and 8D are views illustrating that the locker signal does not vary where discontinuous variation of the oscillation wavelength occurs, and particularly.

FIG. 8C illustrates a manner of variation of the wavelength locker signal when the temperature only of the first etalon 9 is varied and the oscillation frequency hops to the longer wavelength side where the period of the external etalon 16 is set to 0.8 nm and the period of the first etalon 9 is set to 1.5 nm while the period of the second etalon 10 is set to 1.6 nm which is equal to 2 times the period of the external etalon 16.

Figure 8D:
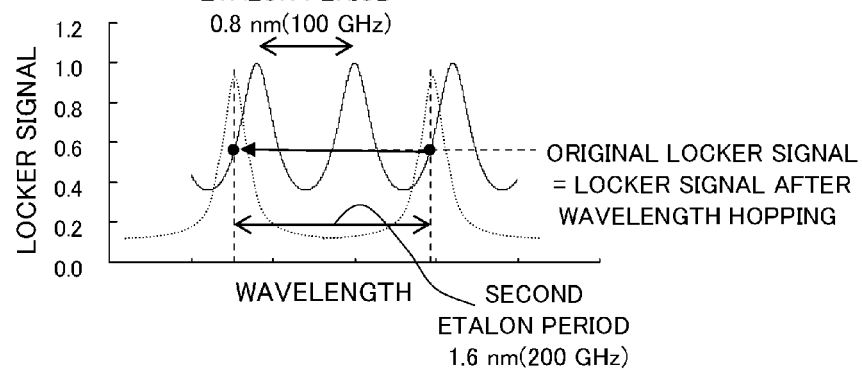

FIG. 8D illustrates a manner of variation of the wavelength locker signal when the temperature only of the first etalon 9 is varied and the oscillation frequency hops to the shorter wavelength side where the period of the external etalon 16 is set to 0.8 nm and the period of the first etalon 9 is set to 1.5 nm while the period of the second etalon 10 is set to 1.6 nm which is equal to 2 times the period of the external etalon 16.

It is to be noted that, in FIGS. 8A to 8D, variation of the wavelength locker signal defined by the transmission characteristic (transmission spectrum) of the external etalon 16 is indicated by a solid line curve, and the period of the wavelength locker signals coincides with the period of the external etalon 16 (here, $\Delta\lambda 3=0.8$ nm; 100 GHz expressed in terms of the frequency).

Meanwhile, the amount of discontinuous variation of the oscillation wavelength (tunable width) where the temperature only of the first etalon 9 is varied coincides with the period of the second etalon 10 as seen in FIGS. 8A and 8B (here, $\Delta\lambda 2=1.8$ nm; 225 GHz expressed in terms of the frequency). It is to be noted that, in FIGS. 8A and 8B, the transmission characteristic (transmission spectrum) of the second etalon 10 is indicated by a dotted line curve.

Where the period of the external etalon 16 is set to 0.8 nm and the period of the second etalon 10 is set to 1.8 nm equal to 2.25 times the period of the external etalon 16 as described above, when the oscillation wavelength hops from one peak wavelength to another peak wavelength of the second etalon 10, the wavelength locker signal hops from a slope portion to a peak portion or a bottom portion of the characteristic of the external etalon 16 as illustrated in FIG. 8a or 8B. In short, in such a relationship between the period of the external etalon 16 and the period of the second etalon 10 as in the present embodiment, when the temperature of the second etalon 10 is fixed while the temperature of the first etalon 9 is varied until the oscillation wavelength varies discontinuously, the wavelength locker signal varies discontinuously. As a result, by detecting a discontinuous point of the wavelength locker signal, a discontinuous point of the oscillation wavelength can be detected with certainty.

On the other hand, if the period of the external etalon 16 is set to 0.8 nm and the period of the first etalon 9 is set to 1.5 nm while the period of the second etalon 10 is set to 1.6 nm which is equal to 2 times the period of the external etalon 16, then when the temperature only of the first etalon 9 is varied, the oscillation wavelength varies discontinuously at intervals of 1.6 nm which is the period of the second etalon 10 (200 GHz expressed in terms of the frequency). In this instance, since the amount of the discontinuous variation of the oscillation wavelength is equal to an integral multiple of the period of the external etalon 16, when the oscillation wavelength hops from one peak wavelength to another peak wavelength of the second etalon 10, the wavelength locker signal hops from a slope portion to another slope portion of the transmission characteristic of the external etalon 16 as illustrated in FIGS. 8C and 8D. In short, when the oscillation wavelength varies discontinuously, the wavelength locker signal does not vary.

In this manner, if the period of the etalons in the cavity which defines a specific wavelength interval at which the oscillation wavelength varies discontinuously is equal to N time (N is an integer equal to or greater than 1) the period of the external etalon 16 which defines the wavelength locker signal, then even if the oscillation wavelength varies discontinuously, the wavelength locker signal does not vary. Therefore, a discontinuous point of the oscillation wavelength cannot be detected from the wavelength locker signal.

It is to be noted that this similarly applies also where the period of the etalons in the cavity is equal to N+0.5 (N is an integer greater than 1) times the period of the external etalon 16 which defines the wavelength locker signal.

Therefore, in order to make it possible to detect a discontinuous point of the oscillation wavelength with certainty from a discontinuous point of the signal intensity of the wavelength locker signal (monitoring signal) calculated based on the output signal from the wavelength locker 3, it is necessary to set the relationship between the period of the etalons in the cavity which defines the specific discontinuous interval at which the oscillation wavelength varies discontinuously and the period of the external etalon 16 which defines the wavelength locker signal so as to be kept away from a value at or in the proximity of N times or N+0.5 times.

Further, depending upon an adjustment error of a peak wavelength position of the external etalon 16, a variation sometimes occurs with a lock point at which the oscillation wavelength is to be locked.

Accordingly, if this variation is also taken into consideration, then the period of the etalons in the cavity which defines the particular wavelength interval at which the oscillation wavelength varies discontinuously is preferably set so as to be equal to N+0.15 to N+0.35 times or N+0.65 to N+0.85 times (N is an integer equal to or greater than 0) the period of the external etalon 16 which defines the wavelength locker signal. Where the period of the etalons in the cavity is set in this manner, when the oscillation wavelength varies discontinuously, the wavelength locker signal varies with certainty, and therefore, a discontinuous point of the oscillation wavelength can be detected with certainty from the wavelength locker signal.

In the present embodiment, it is assumed that the oscillation wavelength is selected, for example, by fixing the position of a peak wavelength of the second etalon 10 and adjusting the temperature of the first etalon 9 (varying the wavelength controlling parameter continuously) to vary the position of the peak wavelength of the first etalon 9.

In this instance, the oscillation wavelength varies stepwise, and discontinuous variation of the oscillation wavelength occurs at intervals of a wavelength corresponding to the interval (period) $\Delta\lambda 2$ between peak wavelengths of the second etalon 10 [refer to, for example, FIG. 6B]. Therefore, the second etalon 10 has a period which gives rise to discontinuous variation of the oscillation wavelength (peak wavelength interval; here $\Delta\lambda 2=1.8$ nm). In other words, the second etalon 10 has a periodic characteristic for bringing about discontinuous variation of the oscillation wavelength with respect to continuous variation of the wavelength controlling parameter.

In the present embodiment, the period of the second etalon 10 (period of the peak wavelength) and the period of the external etalon 16 (monitoring wavelength filter provided in the monitoring section) provided in the wavelength locker 3 (period of the peak wavelength) are set such that the wavelength locker signal (monitoring signal) varies (varies discontinuously) when the oscillation wavelength varies discontinuously. In particular, in the present embodiment, the relationship between the second etalon 10 and the external etalon 16 is set such that the values of the transmittance of the external etalon 16 at adjacent oscillation wavelengths to each other from among oscillation wavelengths which exhibit a discontinuous variation where the temperature controlling parameter is varied continuously (that is, which are selected by continuous variation of the wavelength controlling parameter) may not be equal to each other (may be different from each other).

In particular, the second etalon 10 is set so as to have a period equal to 2.25 times the period of the external etalon 16 so that, when the oscillation wavelength varies discontinuously, the wavelength locker signal (monitoring signal) varies by more than a predetermined value (by more than a reference variation amount).

Consequently, since the wavelength locker signal varies with certainty when the oscillation wavelength varies discontinuously, a discontinuous point of the oscillation wavelength can be detected with certainty from the wavelength locker signal.

It is to be noted that, in the present embodiment, the tunable laser section 2 is formed as a tunable laser which can emit light with an arbitrary wavelength in the C-band (1,525 to 1,565 nm) or the L-band (1,570 to 1,610 nm), or in other words, which has a tunable wavelength width of approximately 40 nm. Therefore, if the mode interval ($\Delta\lambda 2$) is set, for example, 2 to 4 nm, then the tunable laser section 2 is used over a wide wavelength range of 10 to 20 times.

It is to be noted that, while the present embodiment is described above taking a case wherein the period of the second etalon 10 is set to 1.8 nm equal to 2.25 times the period of the external etalon 16 as an example, the present invention is not limited to this and it is only necessary for the period of the second etalon 10 (specific wavelength interval at which the oscillation wavelength varies discontinuously; discontinuous wavelength variation amount) to be equal to N+0.15 to N+0.35 times or N+0.65 to N+0.85 times (N is an integer equal to or greater than 0) the period of the external etalon 16. Further, while the present embodiment is described above taking a case wherein, assuming a case wherein only the temperature of the first etalon 9 is varied, the period of the second etalon 10 which coincides with the amount of discontinuous variation of the oscillation wavelength satisfies the condition described hereinabove as an example, for example, where only the temperature of the second etalon 10 is to be varied, the period of the first etalon 9 which coincides with the amount of discontinuous variation of the oscillation wavelength should be set so as to be equal to N+0.15 to N+0.35 times or N+0.65 to N+0.85 times (N is an integer equal to or greater than 0) the period of the external etalon 16. Naturally, both of the periods of the first etalon 9 and the second etalon 10 may be set so as to satisfy the condition given hereinabove. In this instance, the temperature of any one of the first etalon 9 and the second etalon 10 may be varied.

In particular, it is only necessary for the period of at least one of the wavelength filters having periodic peak wavelengths different from each other in the cavity to be equal to N+0.15 to N+0.35 times or N+0.65 to N+0.85 times (N is an integer equal to or greater than 0) the period of the monitoring wavelength filter (wavelength filter provided in the wavelength locker 3 outside the cavity). This makes it possible for the monitoring signal (wavelength locker signal) to vary by at least approximately 10% with reference to the highest signal value when the oscillation wavelength varies discontinuously.

Incidentally, in the present embodiment, after a relationship between the period (FSR) of the second etalon 10 and the period (FSR) of the external etalon 16 is set, the controller 5 continuously varies the temperature controlling parameter to vary the oscillation wavelength of the tunable laser section 2, detects a discontinuous point of the wavelength locker signal (monitoring signal) and sets (updates) the operating point of the tunable laser section 2 based on the discontinuous point of the wavelength locker signal (monitoring signal).

In the following, control upon operating point setting (updating) (a controlling method of the tunable laser) carried out by the controller 5 provided in the tunable laser apparatus according to the present embodiment is described.

First, the controller 5 varies the wavelength controlling signal for the first heater 11 provided in the first etalon 9 of the tunable laser section (tunable laser) 2 to vary the temperature of the first heater 11, that is, the temperature of the first etalon 9. Consequently, the oscillation wavelength of the tunable laser section 2 which includes the second etalon 10 having a periodic characteristic which gives rise to a discontinuous variation of the oscillation wavelength is varied.

Then, the controller 5 detects a discontinuous point of a wavelength locker signal (monitoring signal) obtained in response to the oscillation wavelength of the tunable laser section 2 through the external etalon (monitoring wavelength filter) 16 which is set such that, when the oscillation wavelength varies discontinuously, the wavelength locker signal (monitoring signal) varies by more than a predetermined value (greater than a reference variation amount; discontinuously) from a relationship to the period of the second etalon 10. In particular, a discontinuous point of the monitoring signal is detected depending upon whether or not the variation amount of the monitoring signal when the wavelength controlling parameter is varied by a fixed amount is equal to or higher than a threshold value set in advance.

Here, the controller 5 first varies the oscillation wavelength of the tunable laser section 2 to the longer wavelength side to detect a discontinuous point on the longer wavelength side of the wavelength locker signal (monitoring signal) in response to the oscillation wavelength of the tunable laser section 2. Then, the controller 5 varies the oscillation wavelength of the tunable laser section 2 to the shorter wavelength side to detect a discontinuous point on the shorter wavelength side of the wavelength locker signal (monitoring signal) in response to the oscillation wavelength of the tunable laser section 2.

Then, the controller 5 sets (updates) the operating point of the tunable laser section 2 based on two discontinuous points of the wavelength locker signal (monitoring signal). Here, the operating point of the tunable laser section 2 is set (updated) to a middle point between the discontinuous point on the longer wavelength side and the discontinuous point on the shorter wavelength side.

Further details are described below.

Figure 9:
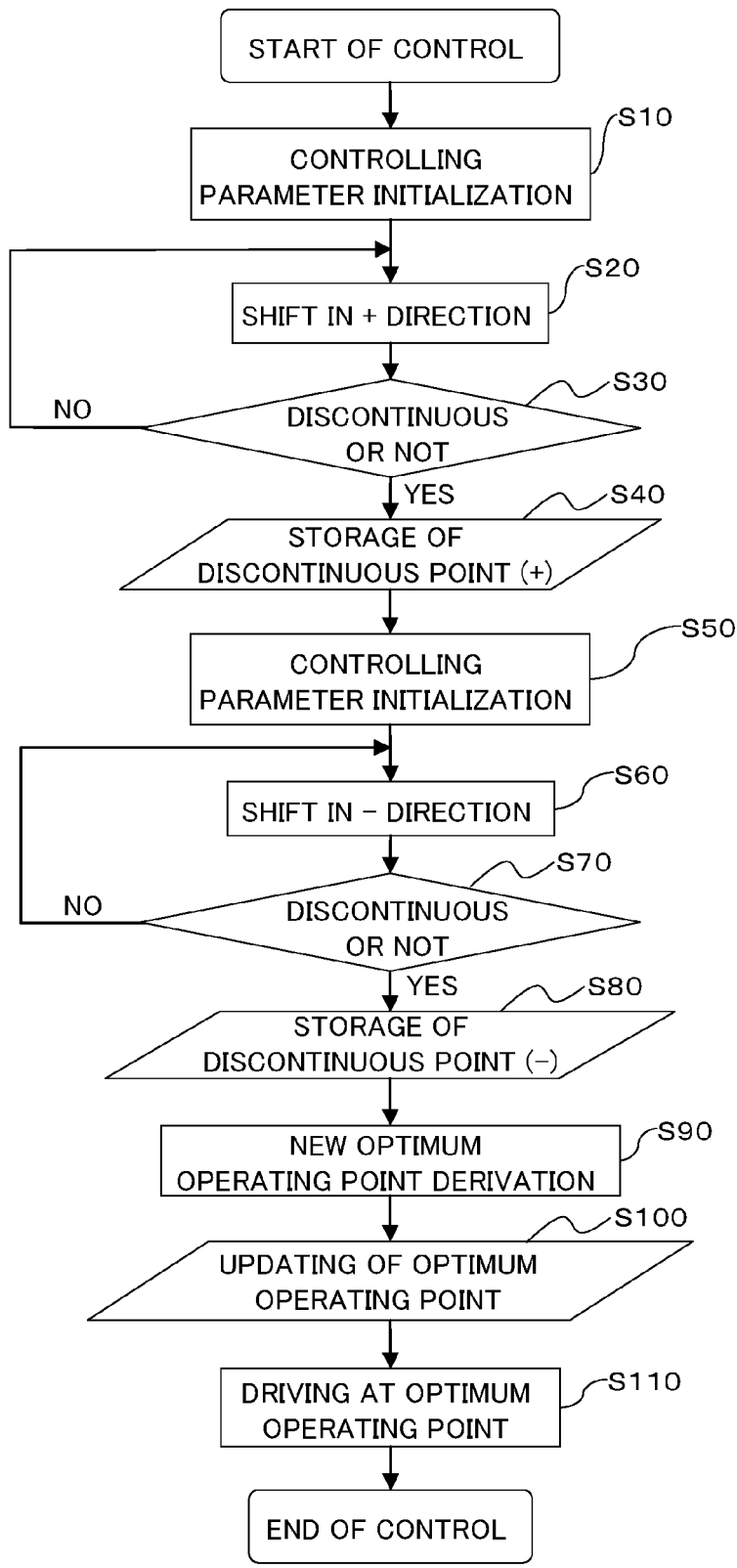
FIG. 9 is a flow chart illustrating a controlling method upon operating point setting for the tunable laser module according to the first embodiment.

Referring to FIG. 9, the controller 5 first carries out initialization of the wavelength controlling parameter of the tunable laser section 2 (here, the temperatures of the first etalon 9 and the second etalon 10) (step S10).

In particular, the controller 5 reads out a controlling value for controlling the oscillation wavelength to a desired oscillation wavelength from within the table in which a plurality of oscillation wavelengths and controlling values (wavelength controlling signal values) are stored in an associated relationship with each other as initial setting values. Then, the controller 5 controls the temperatures of the first etalon 9 and the second etalon 10 of the tunable laser section 2 based on the controlling value.

Then, the controller 5 shifts the temperature of the first etalon 9 of the tunable laser section 2 in one direction (here, in the positive direction; +direction) (step S20).

In particular, the controller 5 gradually increases (sweeps) the controlling value for controlling the temperature of the first etalon 9 of the tunable laser section 2 (wavelength controlling signal value for the first heater 11) to raise the temperature of the first etalon 9 of the tunable laser section 2.

Then, the controller 5 decides whether or not the oscillation wavelength has varied discontinuously (step S30).

In particular, the controller 5 decides whether or not the signal intensity of the wavelength locker signal (monitoring signal) determined based on the output signal (monitoring signal) from the wavelength locker 3 has varied discontinuously. Here, the controller 5 decides whether or not the signal intensity has varied by more than a predetermined value, that is, whether or not the signal intensity of the wavelength locker signal (monitoring signal) has varied by an amount greater than a reference variation amount for the signal intensity of the wavelength locker signal (monitoring signal) which varies when the wavelength controlling parameter (here, the temperature) is varied by a fixed value.

If the controller 5 decides that the signal intensity of the wavelength locker signal has not varied discontinuously (NO route), then the processing returns to step S20 so that the processes at steps S20 and S30 are repeated. In particular, the controller 5 increases the controlling value for controlling the temperature of the first etalon 9 of the tunable laser section 2 stepwise to raise the temperature of the first etalon 9 of the tunable laser section 2 stepwise. Then, the controller 5 decides whether or not the signal intensity has varied discontinuously every time.

Thereafter, if the controller 5 decides that the signal intensity of the wavelength locker signal has varied discontinuously (YES route), then it stores the controlling value when the signal intensity of the wavelength locker signal exhibits the discontinuous variation as a controlling value (current value) at the discontinuous point on the longer wavelength side (in the positive direction) into the memory (step S40).

Then, similarly as at step S10 described hereinabove, the controller 5 carries out initialization of the wavelength controlling parameter for the tunable laser section 2 (here, the temperatures of the first etalon 9 and the second etalon 10) (step S50).

Here, the controller 5 shifts the temperature of the first etalon 9 of the tunable laser section 2 in the other direction (here, in the negative direction; −direction) (step S60).

In particular, the controller 5 decreases (sweeps) the controlling value for controlling the temperature of the first etalon 9 of the tunable laser section 2 to lower the temperature of the first etalon 9 of the tunable laser section 2.

Thereafter, the controller 5 decides whether or not the oscillation wavelength has varied discontinuously (step S70).

In particular, the controller 5 decides whether or not the signal intensity of the wavelength locker signal (monitoring signal) determined based on the output signal (monitoring signal) from the wavelength locker 3 has varied discontinuously. Here, the controller 5 decides whether or not the signal intensity has varied by more than a predetermined value, that is, whether or not the signal intensity of the wavelength locker signal (monitoring signal) has varied by more than a reference variation amount for the signal intensity of the wavelength locker signal (monitoring signal) which varies when the wavelength controlling parameter (here, the temperature) is varied by a fixed value.

If the controller 5 decides that the signal intensity of the wavelength locker signal has not varied discontinuously (NO route), then the processing returns to step S60 so that the processes at steps S60 and S70 are repeated. In particular, the controller 5 decreases the controlling value for controlling the temperature of the first etalon 9 of the tunable laser section 2 stepwise to lower the temperature of the first etalon 9 of the tunable laser section 2 stepwise. Then, the controller 5 decides whether or not the signal intensity has varied discontinuously every time.

Thereafter, when the controller 5 decides that the signal intensity of the wavelength locker signal has varied discontinuously (YES route), the controller 5 stores the controlling value when the signal intensity of the wavelength locker signal exhibits the discontinuous variation as a controlling value (current value) at the discontinuous point on the shorter wavelength side (in the negative direction) into the memory (step S80).

Then, the controller 5 decides, as a new optimum operating point, a middle point between the discontinuous point on the longer wavelength side (in the positive direction) and the discontinuous point on the shorter wavelength side (in the negative direction) (step S90).

In particular, the controller 5 reads out the controlling value at the discontinuous point on the longer wavelength side (in the positive direction) and the controlling value at the discontinuous point on the shorter wavelength side (in the negative direction) from the memory and determines an intermediate controlling value between the controlling values. Then, the controller 5 sets (updates), as a new operating point, the decided middle point (step S100).

In particular, the controller 5 rewrites the controlling value (wavelength controlling signal value) for controlling the oscillation wavelength to the desired oscillation wavelength stored in the table with the determined intermediate controlling value.

After setting (updating) of the operating point is carried out in this manner, the controller 5 reads out a new controlling value (wavelength controlling signal value) for controlling the oscillation wavelength to a desired oscillation wavelength from the table and controls the temperature of the first etalon 9 of the tunable laser section 2 based on the controlling value to drive the tunable laser section 2 at the updating operating point (step S110). Consequently, also in a case wherein, for example, time degradation occurs, the tunable laser section 2 is driven at the optimum operating point.

It is to be noted that such control for setting (updating) of the operating point as just described is carried out for each of a plurality of oscillation wavelengths which vary discontinuously.

Where setting (updating) of the operating point is carried out in this manner, in the present embodiment, since such a configuration as described above is adopted, when the oscillation wavelength varies discontinuously, if the intensity of light passing through the external etalon 16 provided in the wavelength locker (monitoring section) 3 is detected by the optical detector 17, then the output signal (monitoring signal) of the optical detector 17 varies discontinuously without fail, and also the wavelength locker signal determined based on the output signal of the optical detector 17 comes to vary discontinuously without fail. Therefore, it is possible to detect a discontinuous point of the oscillation wavelength with certainty. Consequently, variation of a discontinuous point of the oscillation wavelength caused by time degradation can be monitored successively by such a monitoring section as the wavelength locker 3 without using, for example, a wavemeter, and it is possible to normally set (update) the tunable laser section 2 to an optimum operating point based on the monitored discontinuous point of the signal. As a result, stabilized laser oscillation can be obtained.

It is to be noted that time degradation of a laser occurs in such a long unit of time as several years in the maximum. Therefore, it is not necessary to normally carry out such control as to update an optimum operating point, but, for example, such updating of an operating point as described above may be carried out when the laser is re-started.

Further, while, in the present embodiment, a middle point between two discontinuous points at which discontinuous wavelength variation occurs is adopted as an optimum operating point, the optimum operating point is not limited to this, but a point at which most stable operation is obtained in regard to the oscillation state of the laser may be adopted as the optimum operating point.

Accordingly, with the tunable laser module, tunable laser apparatus and controlling method for a tunable laser according to the present embodiment, there is an advantage that it is possible to detect a discontinuous point at which the oscillation wavelength varies discontinuously without complicating the configuration of the tunable laser module 1 and set (update) the operating point with certainty avoiding the discontinuous point and points in the proximity of the discontinuous point, and stabilized single mode oscillation can be implemented.

It is to be noted that, while, in the present embodiment, two wavelength filters (etalons) are disposed in a laser cavity and, in order to adjust the oscillation wavelength so as to comply with the ITU-T grid, the positions of peak wavelengths of the wavelength filters are controlled independently of each other (in other words, while two wavelength controlling sections are provided in the cavity), it is not limited to this configuration, but it is only necessary to dispose at least one wavelength controller in the cavity.

For example, the configuration of the embodiment described above may be modified such that one of the first wavelength filter (first etalon) 9 and the second wavelength filter (second etalon) 10 is controlled so as to vary the position of a peak wavelength by controlling the wavelength controlling parameter (here, by continuously varying the temperature) while the position of a peak wavelength of the other one of them is fixed.

In this instance, the period (interval) of the peak wavelength of the other wavelength filter is preferably set so as to comply with the ITU-T grid. In particular, the period of the other wavelength filter (period of the peak wavelength) is preferably set to an integral multiple of 12.5 GHz, 25 GHz, 50 GHz or 100 GHz where the period is converted into a frequency. This makes it unnecessary to carry out control of adjusting the oscillation wavelength so as to comply with the ITU-T grip every time the oscillation wavelength is controlled to any of the plural oscillation wavelengths which vary discontinuously.

Figure 11A:
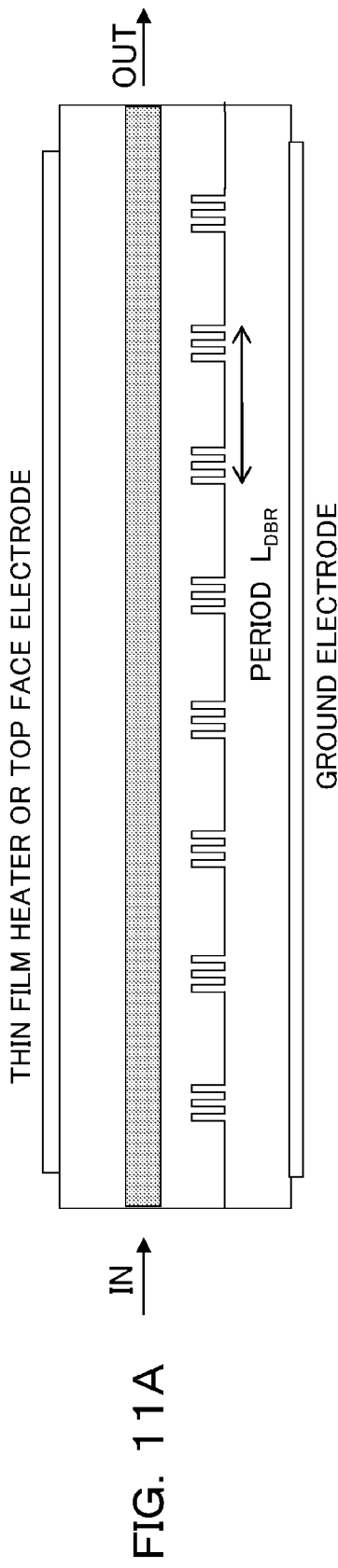
FIGS. 11A and 11B are schematic sectional views illustrating a configuration of a modification to the wavelength filter in the tunable laser section provided in the tunable laser module according to the first embodiment, and particularly.
Figure 11B:
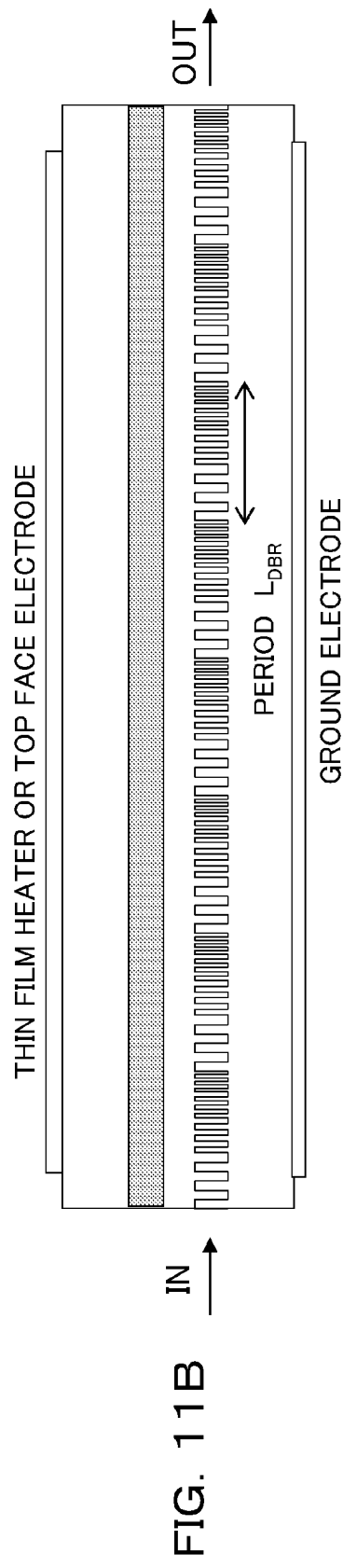
Figure 12:
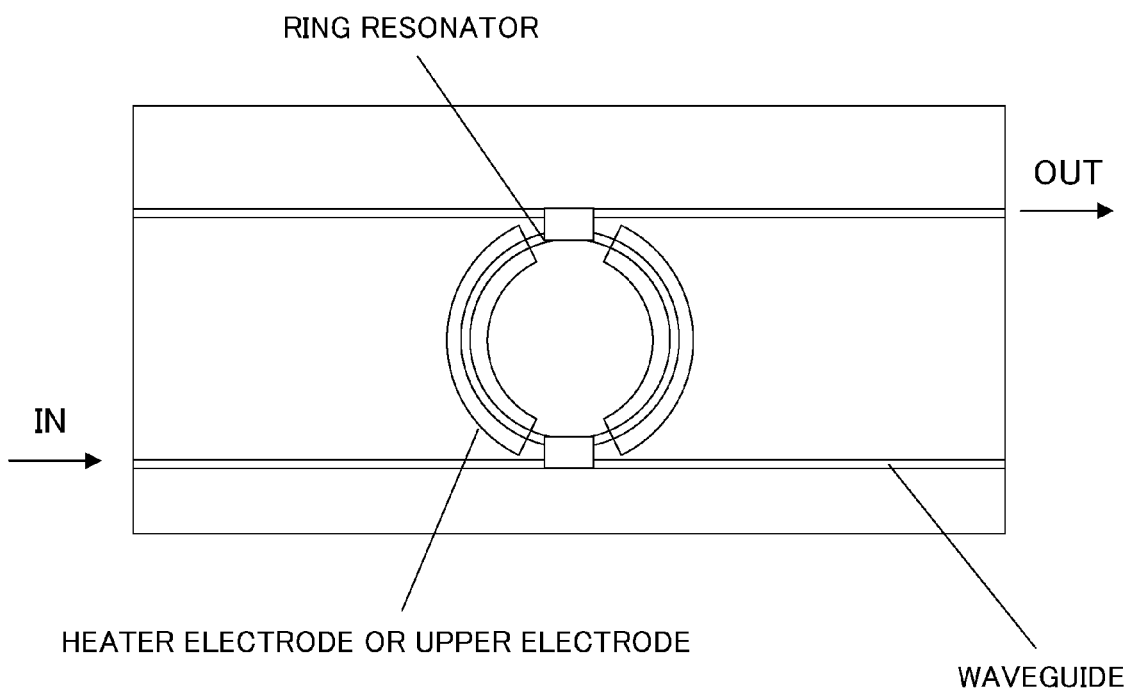
FIG. 12 is a schematic top plan view illustrating the configuration of the modification to the wavelength filter in the tunable laser section provided in the tunable laser module according to the first embodiment, and particularly.

Further, while, in the present embodiment, an etalon is used for the first wavelength filter and the second wavelength filter, the first and second wavelength filters are not limited to this, and it is possible to use a wavelength filter having a periodic peak wavelength such as, for example, a sampled grating type wavelength filter, a diffraction gratin type wavelength filter including a sampled grating distributed Bragg reflector (SG-DBR) type wavelength filter as illustrated in FIG. 11A and a super structure grating distributed Bragg reflector (SSG-DBR) type wavelength filter as illustrated in FIG. 11B, and a ring resonator type wavelength filter as illustrated in FIG. 12. It is to be noted that the wavelength filter may be any of a transmission type wavelength filter and a reflection type wavelength filter.

In this instance, for example, by forming electrodes (for example, an upper face electrode and a ground electrode) for a waveguide such that current injection or voltage application is carried out through the electrodes, the position of a peak wavelength of the wavelength filter can be varied. Also by forming a thin film heater for a waveguide such that temperature control is carried out through the thin film heater, the peak wavelength position can be varied.

Further, since, in a laser formed from a combination of a plurality of parts as in the present embodiment, the cavity length is great and the longitudinal mode interval is sufficiently small, variation of the oscillation wavelength by the longitudinal mode position is as small as it can be ignored with respect to the period of the external etalon 16. Accordingly, the influence of the longitudinal mode position on the locker signal is very little. Therefore, even where the longitudinal mode position is not controlled, the effect of wavelength hopping detection by the present embodiment is exhibited.

Second Embodiment

Now, a tunable laser module, a tunable laser apparatus and a controlling method for a tunable laser according to a second embodiment are described with reference to FIGS. 13 to 17.

Figure 13:
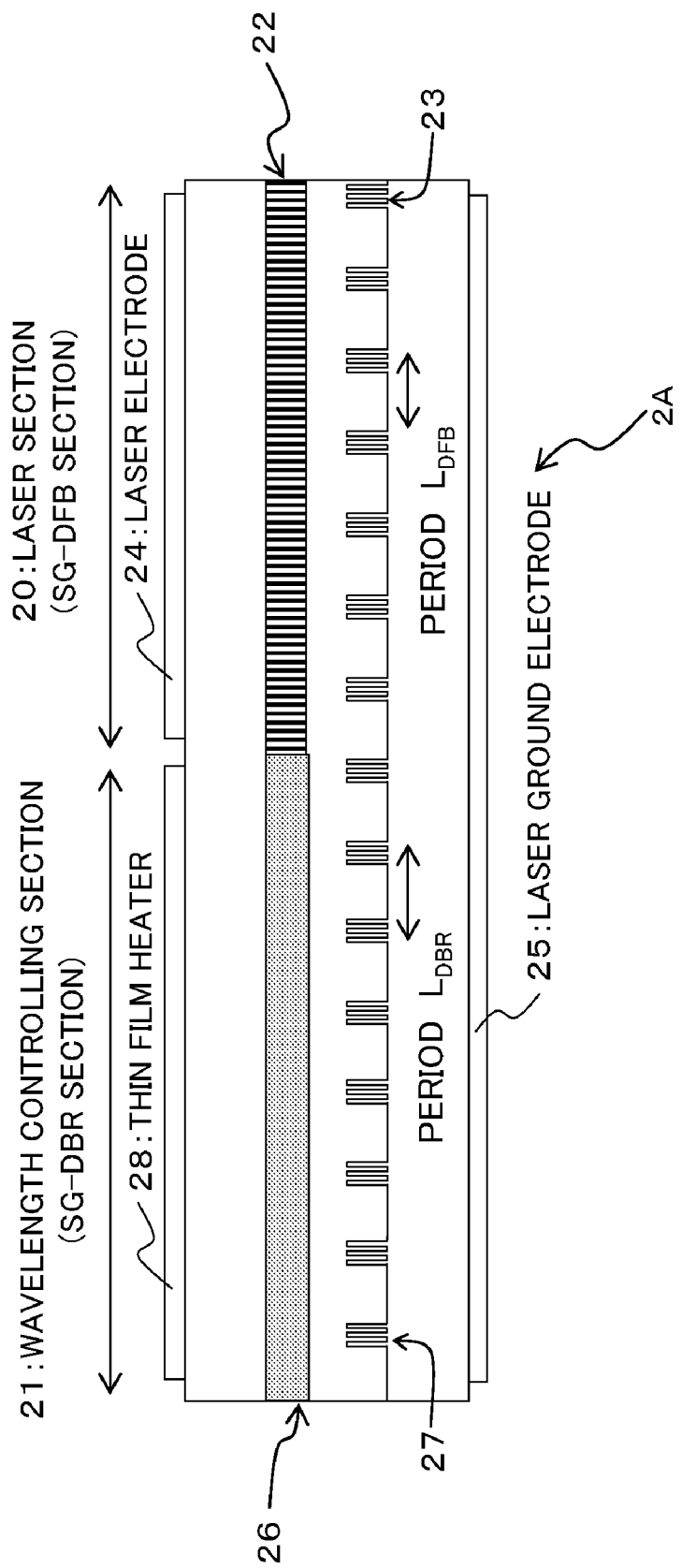
FIG. 13 is a schematic sectional view illustrating a configuration of a tunable laser device provided in a tunable laser module according to a second embodiment.
Figure 14:
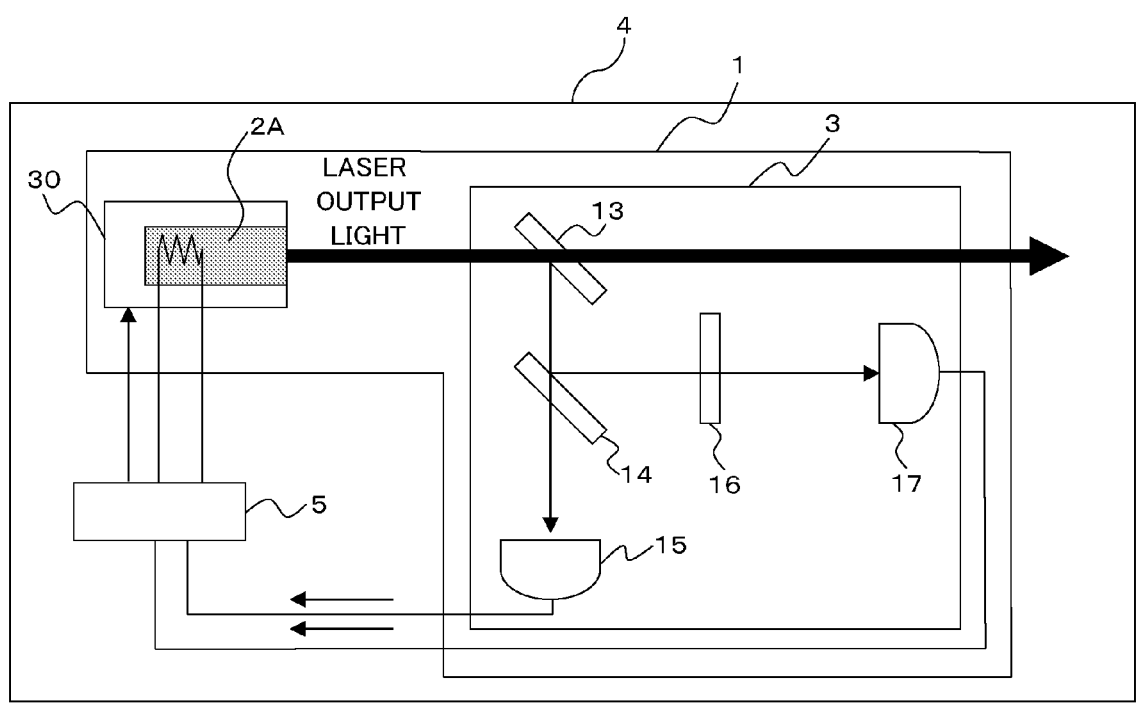
FIG. 14 is a schematic view illustrating a configuration of the tunable laser module according to the second embodiment.

The present embodiment is different from the first embodiment described above in that the tunable laser section 2 is formed from a tunable laser device 2A as seen in FIGS. 13 and 14.

It is to be noted that the configuration of the wavelength locker 3 provided outside the tunable laser section 2 (outside the cavity) is same as that in the first embodiment described hereinabove, and therefore, overlapping description of the same is omitted here. Further, in FIG. 14, like elements to those in the first embodiment described hereinabove (refer to FIG. 1) are denoted by like reference numerals.

The present tunable laser device 2A is a tunable laser whose wavelength is varied by the vernier effect and includes a laser section 20 and a wavelength controlling section 21 on a semiconductor substrate as illustrated in FIG. 13. In particular, in the present embodiment, the tunable laser section 2 is formed as an integrated device (tunable laser device) wherein a gain medium (semiconductor optical amplifier) and a wavelength filter are monolithically integrated on a semiconductor substrate.

Here, the laser section 20 is an SG-DFB laser section including a gain waveguide (active waveguide) 22 having a band gap wavelength of, for example, approximately 1,550 nm and having a gain at a wavelength in the proximity of 1,500 to 1,600 nm used in optical communication, and a diffraction grating (here, sampled grating; period $L_{DFB}$; second wavelength filter) 23 formed along the gain waveguide 22 and having one period.

In the present embodiment, electrodes (a laser electrode 24 and a laser ground electrode 25) for injecting current are formed above and below the gain waveguide 22.

The wavelength controlling section 21 is an SG-DBR section including a passive waveguide 26 having a band gap wavelength of, for example, approximately 1,300 nm and comparatively transparent with regard to light in the proximity of 1,550 nm, and a diffraction grating (here, sampled grating; period $L_{DBR}$; first wavelength filter) 27 formed along the passive waveguide 26 and having a different period.

In the present embodiment, a thin film heater 28 for locally adjusting the temperature of the passive waveguide 26 is formed above the passive waveguide 26. Then, current is supplied to the thin film heater 28 to vary the temperature of the passive waveguide 26 thereby to vary the refractive index of the passive waveguide 26 so that the position of a reflection peak wavelength of the wavelength controlling section 21 can be shifted. In other words, in the present embodiment, the thin film heater (wavelength controlling element) 28 for varying the temperature (wavelength controlling parameter) of the wavelength controlling section 21 (particularly the first wavelength filter) is provided. This thin film heater 28 is controlled based on the wavelength controlling signal from the controller 5.

Incidentally, the period $L_{DFB}$ of the diffraction grating 23 of the laser section 20 is adjusted such that the period $\Delta\lambda 1$ of the reflection peak wavelength is, for example, $\Delta\lambda 1 = 1.85$ nm.

Meanwhile, the period $L_{DBR}$ of the diffraction grating 27 of the wavelength controlling section 21 is adjusted such that the period $\Delta\lambda 2$ of the reflection peak wavelength is, for example, $\Delta\lambda 2 = 1.7$ nm.

In this manner, the diffraction grating 23 of the laser section 20 and the diffraction grating 27 of the wavelength controlling section 21 have periods different from each other (different periodical peak wavelengths).

A laser cavity is formed by jointing (butt-jointing) the two waveguides 22 and 26 formed in the proximity of the diffraction gratings 23 and 27 having different periods from each other. In this instance, the diffraction gratings 23 and 27 provided in the laser section 20 and the wavelength controlling section 21 function as two reflecting mirrors which form the laser cavity and two wavelength filters (etalons) having different periodic peak wavelengths. Further, the gain waveguide 22 of the laser section 20 is a gain medium.

Incidentally, in the present embodiment, the tunable laser element (tunable laser section) 2A is placed, for example, on a Peltier device 30 as illustrated in FIG. 14, and the temperature of the entire device can be adjusted. In short, in the present embodiment, the tunable laser module 1 includes the Peltier element (wavelength controlling element) 30 for varying the temperature (wavelength controlling parameter) of the entire tunable laser device 2A including the two wavelength filters 23 and 27. This Peltier element 30 is controlled based on the wavelength controlling signal from the controller 5.

In this manner, in the present embodiment, the oscillation wavelength can be controlled by temperature control of the wavelength controlling section 21 by the thin film heater 28 described hereinabove and temperature control of the entire device by the Peltier element 30.

Figure 15:
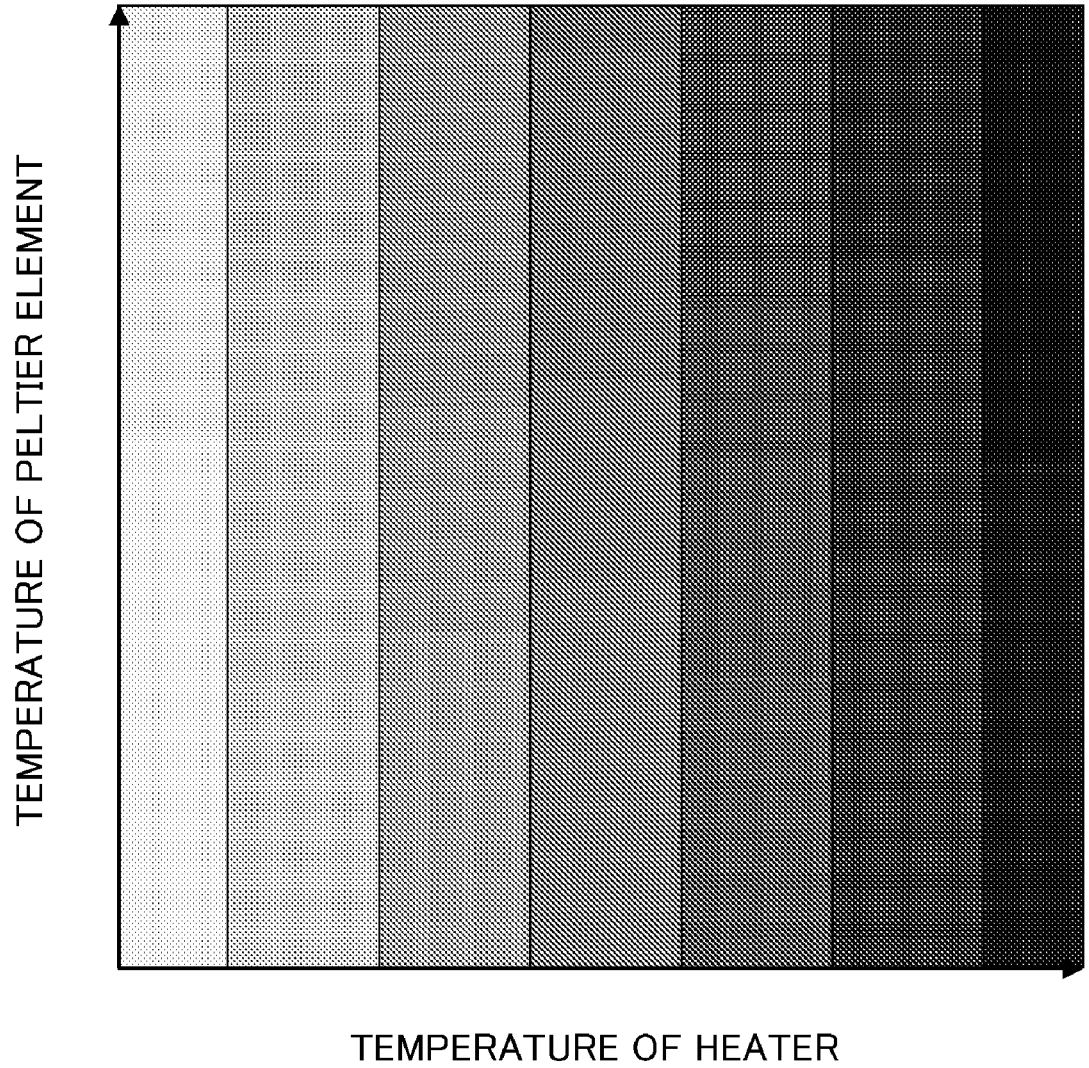
FIG. 15 is a map illustrating a relationship between the temperature of a Peltier element (device) and the temperature of a thin film heater of the tunable laser device provided in the tunable laser module according to the second embodiment.

Here, FIG. 15 illustrates a map which indicates variation of the oscillation wavelength with respect to the two controlling parameters described hereinabove, that is, the temperature of the thin film heater 28 (temperature of the wavelength controlling section 21) and the temperature of the Peltier element 30 (temperature of the entire device). It is to be noted that, in FIG. 15, the oscillation wavelength becomes longer as the color becomes deeper. Further, a boundary of the variation in color indicates a discontinuous point at which the oscillation wavelength varies discontinuously.

For example, if the temperature of the wavelength controlling section 21 is gradually raised by the thin film heater 28, then the position of a peak wavelength of the diffraction grating (first wavelength filter) 27 provided in the wavelength controlling section 21 varies and a relative positional displacement appears between the position of the peak wavelength of the diffraction grating 27 and the position of a periodical peak wavelength of the diffraction grating (second wavelength filter) 23 provided in the laser section 20. Consequently, the oscillation wavelength varies discontinuously to the longer wavelength side as shown in FIG. 15.

In the present embodiment, since the period $\Delta\lambda 1$ of the peak wavelength of the diffraction grating (second wavelength filter) 23 provided in the laser section 20 is longer than the period $\Delta\lambda 2$ of the peak wavelength of the diffraction grating (first wavelength filter) 27 provided in the wavelength controlling section 21 ($\Delta\lambda 1 > \Delta\lambda 2$), if the temperature of the wavelength controlling section 21 is raised by the thin film heater 28 to gradually shift the position of the peak wavelength of the diffraction grating (first wavelength filter) 27 provided in the wavelength controlling section 21, then the oscillation wavelength varies stepwise to the longer wavelength side with a wavelength variation width corresponding to the period $\Delta\lambda 1$ of the peak wavelength of the laser section 20. Consequently, it can be selected with which peak wavelength of the laser section 20 should oscillate from among peak wavelengths of the laser section 20.

Meanwhile, by raising the temperature of the entire device by means of the Peltier element 30 within a region between boundary lines across which the density of the pattern varies, the oscillation wavelength can be varied continuously without bringing about wavelength hopping in a state wherein peak wavelengths of the diffraction gratings (wavelength filters) 23 and 27 provided in the laser section 20 and the wavelength controlling section 21 substantially coincide with each other (that is, in a state wherein the laser section 20 oscillates with one peak wavelength thereof). In this instance, since the temperature of the entire device is varied, the positional relationship between the laser section 20 and the wavelength controlling section 21 does not vary. Therefore, the longitudinal mode does not hop to a different mode.

Accordingly, in the present embodiment, in order to obtain oscillation with a desired ITU-T grid wavelength, adjustment should be carried out in the following procedure.

First, the position of the peak wavelength of the diffraction grating (first wavelength filter) 27 provided in the wavelength controlling section 21 is varied by the thin film heater 28 until a peak wavelength of the laser section 20 and a peak wavelength of the wavelength controlling section 21 which are nearest to the desired wavelength coincide with each other.

Then, the temperature of the entire device is varied to shift the oscillation wavelength while the peak wavelengths of the laser section 20 and the wavelength controlling section 21 remain coincident with each other thereby to carry out fine adjustment of the oscillation wavelength so as to comply with a desired ITU-T grid.

It is to be noted here that, while the oscillation wavelength is made comply with the ITU-T grid after the peak wavelength positions of the laser section 20 and the wavelength controlling section 21 are made coincide with each other to select an oscillation wavelength, the adjustment of the oscillation wavelength is not limited to this, but, for example, a peak wavelength of the laser section 20 may first be adjusted to a desired ITU-T grid, whereafter a peak wavelength of the wavelength controlling section 21 is adjusted to a peak wavelength of the laser section 20 to select an oscillation wavelength.

Incidentally, in order to make a wavelength locker signal vary discontinuously with certainty at a discontinuous point of the oscillation wavelength, similarly as in the case of the first embodiment described hereinabove, the relationship between the period of the diffraction grating (second wavelength filter) 23 provided in the laser section 20 and the period of the external etalon 16 should be set such that the amount of discontinuous wavelength variation may be equal to N+0.15 to N+0.35 times or N+0.65 to N+0.85 times (N is an integer equal to or greater than 0) the period of the external etalon 16.

Figure 16:
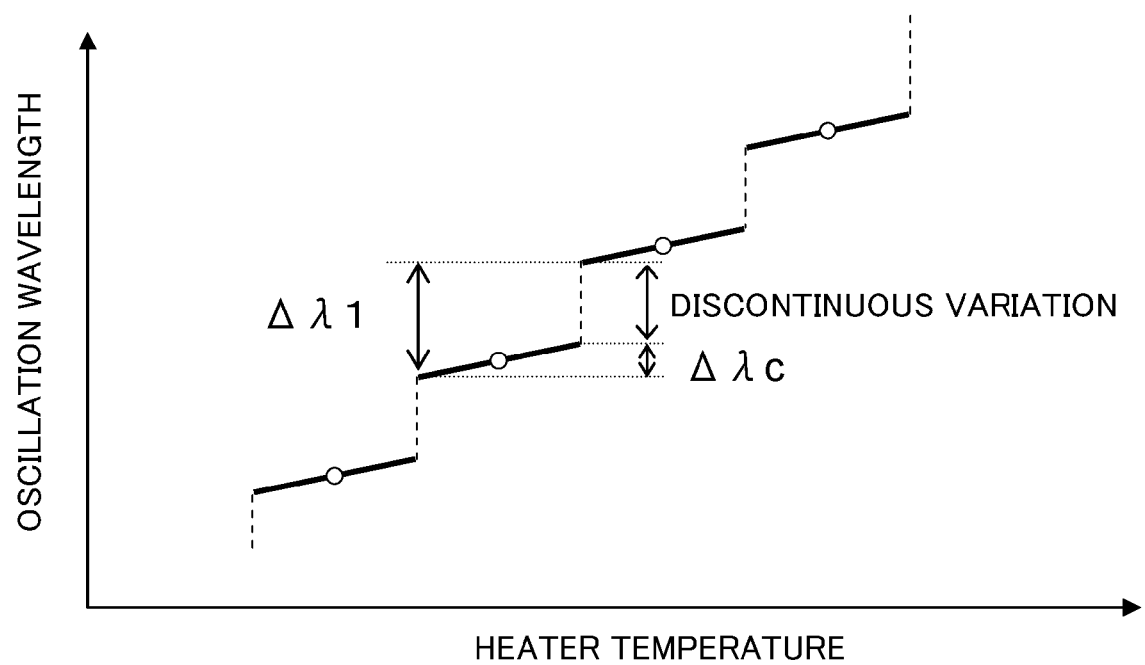
FIG. 16 is a view illustrating variation of the oscillation wavelength where the temperature of the thin film heater of a tunable laser section ($\Delta\lambda 1 > \Delta\lambda 2$) provided in the tunable laser module according to the second embodiment is varied.
Figure 17:
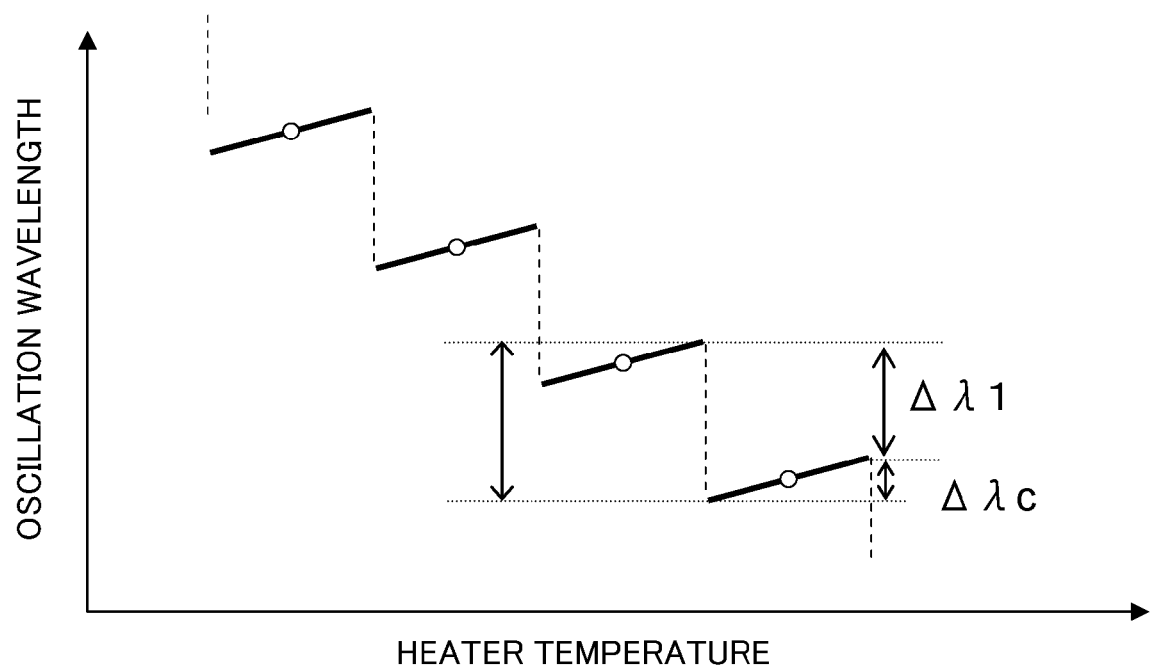
FIG. 17 is a view illustrating variation of the oscillation wavelength where the temperature of the thin film heater of a tunable laser section ($\Delta\lambda 1 < \Delta\lambda 2$) provided in the tunable laser module according to the second embodiment is varied.

However, in the configuration of the present embodiment, the stepwise wavelength variation amount (that is, the period $\Delta\lambda 1$ of the peak wavelength of the laser section 20) and the amount by which the oscillation wavelength actually varies discontinuously are displaced from each other (refer to FIGS. 16 and 17).

Therefore, it is necessary to correct the relationship between the period of the peak wavelength of the laser section 20 and the period of the peak wavelength of the external etalon 16.

This is described in detail below.

Here, FIG. 16 illustrates a manner of variation of the oscillation wavelength with respect to the temperature of the thin film heater 28 of the wavelength controlling section 21.

As seen in FIG. 16, by varying the temperature of the thin film heater 28 (that is, the temperature of the wavelength controlling section 21; wavelength controlling parameter), the oscillation wavelength varies discontinuously stepwise in accordance with the period $\Delta\lambda 1$ of the peak wavelength of the laser section 20 similarly as in the case of the first embodiment described hereinabove.

However, where the tunable laser device 2A as a semiconductor integrated device is used as in the present embodiment, the ratio at which the length of the wavelength filter (here, the diffraction grating 27 of the wavelength controlling section 21) occupies in the length of the cavity is comparatively high.

Therefore, if a peak wavelength of the wavelength filter (diffraction grating 27 of the wavelength controlling section 21) is shifted, for example, to the longer wavelength side, then the cavity longitudinal mode also varies to the longer wavelength side.

As a result, the oscillation wavelength varies by a little amount within one of terraces in which the wavelength varies stepwise. This variation amount $\Delta\lambda c$ of the oscillation wavelength is, for example, more than several tens pm, and this amount cannot be ignored with respect to the period of the external etalon 16 (here, 0.8 nm).

In the configuration of the present embodiment, since the period $\Delta\lambda 2$ of the peak wavelength of the wavelength controlling section 21 is shorter than the period $\Delta\lambda 1$ of the peak wavelength of the laser section 20, if the position of the peak wavelength of the wavelength controlling section 21 is varied to the longer wavelength side, then the oscillation wavelength varies stepwise to the longer wavelength side in accordance with the period $\Delta\lambda 1$ of the peak wavelength of the laser section 20 and the oscillation wavelength varies continuously to the longer wavelength side within one of the terraces in which the wavelength varies stepwise. In this instance, the variation amount of the discontinuous oscillation wavelength actually becomes $\Delta\lambda 1 - \Delta\lambda c$ as seen in FIG. 16.

In order to make the variation amount (variation width) of the discontinuous oscillation wavelength equal to N+0.15 to N+0.35 times or N+0.65 to N+0.85 times (N is an integer equal to or greater than 0) the period of the external etalon 16, the period $\Delta\lambda 1$ of the peak wavelength of the laser section 20 should have a value obtained by addition of $\Delta\lambda c$ to N+0.15 to N+0.35 times or N+0.65 to N+0.85 times (N is an integer equal to or greater than 0) the period of the external etalon 16.

In particular, when the peak position of the reflection characteristic (reflection spectrum) of the diffraction grating (first wavelength filter) 27 provided in the wavelength controlling section 21 is varied, if continuous wavelength variation occurs in a direction same as the direction of discontinuous variation of the oscillation wavelength, then where the continuous wavelength variation amount is represented by $\Delta\lambda c$ and the period of the external etalon 16 is represented by T, the period $\Delta\lambda 1$ of the peak wavelength of the laser section 20 should be set so as to satisfy $$T1(N+0.15)+\Delta\lambda c \sim T1(N+0.35)+\Delta\lambda c \ [T1(N+0.15)+ \Delta\lambda c < \Delta\lambda 1 < T1(N+0.35)+\Delta\lambda c]$$

or $$T1(N+0.65)+\Delta\lambda c \sim T1(N+0.85)+\Delta\lambda c \ [T1(N+0.65)+ \Delta\lambda c < \Delta\lambda 1 < T1(N+0.85)+\Delta\lambda c] \ (N \text{ is an integer equal to or higher than 0}).$$

In the present embodiment, where the period (FSR) T1 of the external etalon 16 is 0.8 nm and $\Delta\lambda c = 0.05$ nm, if the period $\Delta\lambda 1$ is set to $\Delta\lambda 1 = 1.85$ nm, then since this falls in the range of the expression given hereinabove where N=2, the wavelength locker signal varies discontinuously with certainty at a discontinuous point of the oscillation wavelength. Consequently, it is possible to monitor the discontinuous point of the oscillation wavelength with certainty.

It is to be noted that the other details are similar to those of the first embodiment described hereinabove and therefore the description of them is omitted here.

Accordingly, with the tunable laser module, tunable laser apparatus and controlling method for a tunable laser according to the present embodiment, similarly as in the case of the first embodiment described hereinabove, there is an advantage that it is possible to detect a discontinuous point at which the oscillation wavelength varies discontinuously without complicating the configuration of the tunable laser module 1 and set or update the operating point with certainty avoiding the discontinuous point and points in the proximity of the discontinuous point, and stabilized single mode oscillation can be implemented.

Particularly, with a tunable laser wherein a wavelength filter and a gain waveguide are integrated monolithically as in the present embodiment, miniaturization can be anticipated. Further, since the laser itself is formed from a single chip, there is an advantage that assembly of the laser module is easy.

It is to be noted that, while, in the embodiment described above, a case wherein the period of a peak wavelength of the wavelength controlling section 21 is shorter than the period of a peak wavelength of the laser section 20 is taken as an example, the present invention is not limited to this but can be applied also where conversely the period of a peak wavelength of the wavelength controlling section is longer than the period of a peak wavelength of the laser section.

In this instance, if the peak wavelength of the wavelength controlling section is varied to the longer wavelength side, then the oscillation wavelength varies stepwise to the shorter wavelength side in accordance with the period $\Delta\lambda 1$ of the peak wavelength of the laser section and the oscillation wavelength varies continuously to the longer wavelength side within one of the terraces in which the wavelength varies stepwise. In this instance, the variation amount of the discontinuous oscillation wavelength actually becomes $\Delta\lambda 1 + \Delta\lambda c$ as shown in FIG. 17.

In order to cause the variation amount of the discontinuous oscillation wavelength to become equal to N+0.15 to N+0.35 times or N+0.65 to N+0.85 times (N is an integer equal to or greater than 0) the period of the external etalon, the period $\Delta\lambda 1$ of the peak wavelength of the laser section should be set to a value obtained by subtracting $\Delta\lambda c$ from N+0.15 to N+0.35 times or N+0.65 to N+0.85 times (N is an integer equal to or greater than 0) the period of the external etalon.

In particular, when the peak position of the reflection characteristic (reflection spectrum) of the diffraction grating (first wavelength filter) provided in the wavelength controlling section is varied, if continuous wavelength variation occurs in a direction opposite to the direction of the discontinuous variation of the oscillation wavelength, then where the continuous wavelength variation amount is represented by $\Delta\lambda c$ and the period of the external etalon is represented by T1, the period $\Delta\lambda 1$ of the peak wavelength of the laser section should be set so as to satisfy $$T1(N+0.15)-\Delta\lambda c\sim T1(N+0.35)-\Delta\lambda c\ [T1(N+0.15)-\Delta\lambda c<\Delta\lambda 1<T1(N+0.35)-\Delta\lambda c]$$

or $$T1(N+0.65)-\Delta\lambda c\sim T1(N+0.85)-\Delta\lambda c\ [T1(N+0.65)-\Delta\lambda c<\Delta\lambda 1<T1(N+0.85)-\Delta\lambda c]\ (N\ \text{is an integer equal to or higher than 0}).$$

In the present embodiment, the period (FSR) T1 of the external etalon is 0.8 nm, and if the continuous wavelength variation amount $\Delta\lambda c$ is set to $\Delta\lambda c=0.05$ nm, then if the period $\Delta\lambda 1$ is set to $\Delta\lambda 1=1.75$ nm, then the relationship of the expression given hereinabove where N=2 is satisfied. Therefore, the wavelength locker signal varies discontinuously with certainty at a discontinuous point of the oscillation wavelength. Consequently, the discontinuous point of the oscillation wavelength can be monitored with certainty.

Further, while, in the embodiment described above, the thin film heater 28 is provided in the wavelength controlling section 21 and the temperature of the wavelength controlling section 21 is varied to shift the position of a peak wavelength of the wavelength controlling section 21, the shifting of the position of a peak wavelength of the wavelength controlling section 21 is not limited to this. For example, electrodes for current injection or voltage application may be provided on the wavelength controlling section such that the position of the peak wavelength of the wavelength controlling section is shifted by utilizing variation of the refractive index by current injection or voltage application of the wavelength controlling section.

Further, while, in the embodiment described above, as the tunable laser device for which the vernier effect is used, a semiconductor integrated laser of a structure wherein an SG-DFB section and an SG-DBR section are combined is taken as an example, the structure of the laser is not limited to this.

For example, it is also possible to use other lasers such as an SG-DBR laser (refer to, for example, Japanese Patent Laid-Open No. 2003-17803, the entire of content of which is incorporated herein by reference), an SSG-DBR laser (refer to, for example, Japanese Patent Laid-Open No. Hei 6-61577, the entire of content of which is incorporated herein by reference) and a laser formed from a combination of such lasers. In this instance, while two SG-DBRs or SSG-DBRs are combined to carry out tuning operation, they should be configured such that the period of the peak wavelength of at least one of the SG-DBRs or SSG-DBRs has such a relationship as specified in the foregoing description of the embodiment to the period of the peak wavelength of the external etalon.

Further, the present invention can be applied similarly also to a tunable laser wherein, for example, a plurality of ring resonators are integrated (refer to, for example, Japanese Patent Laid-Open No. 2006-278769, the entire of content of which is incorporated herein by reference). In this instance, the period of the peak wavelength of at least one of the plural ring resonators should be configured so as to have such a relationship as specified in the embodiment described hereinabove to the period of the peak wavelength of the external etalon.

Third Embodiment

Now, a tunable laser module, a tunable laser apparatus and a controlling method for a tunable laser according to a third embodiment of the present invention are described with reference to FIGS. 18 to 22.

Figure 18:
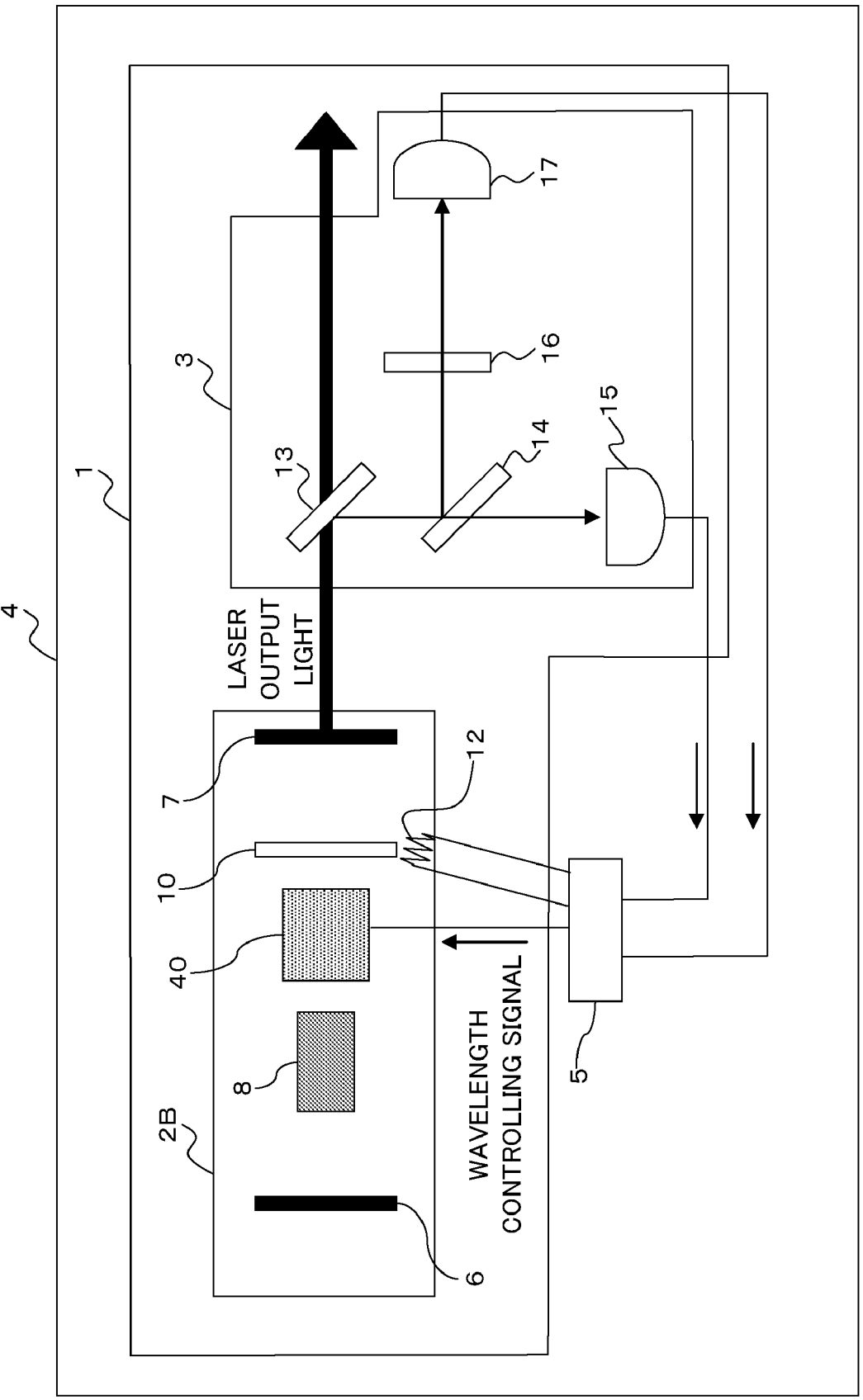
FIG. 18 is a schematic view illustrating a configuration of a tunable laser module according to a third embodiment.

The present embodiment is different from the first embodiment described hereinabove in that one of two wavelength filters provided in a tunable laser section 2B is formed as a tunable filter 40 and two wavelength filters provided in a laser cavity are a combination of an internal etalon 10 and a tunable filter 40 as shown in FIG. 18. It is to be noted that, in FIG. 18, like elements to those of the first embodiment described hereinabove (refer to FIG. 1) are denoted by like reference numerals.

Figure 19A:
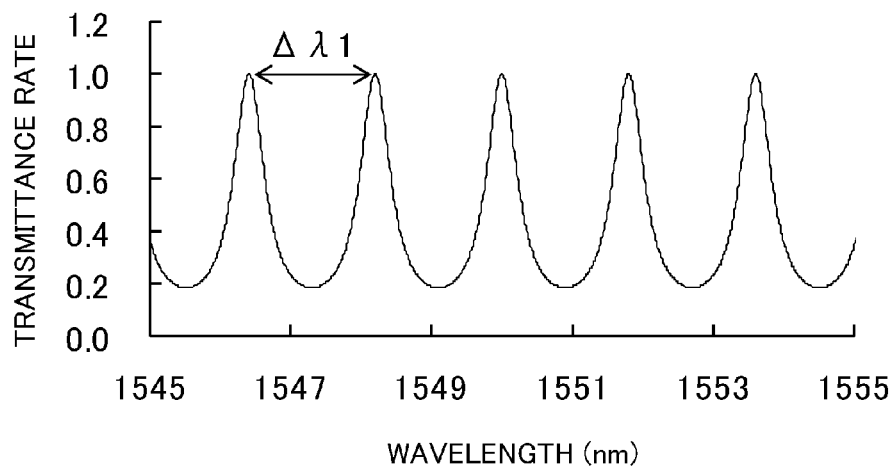
FIGS. 19A to 19C are views illustrating transmission characteristics of filters provided in the tunable laser module according to the third embodiment, and particularly.
Figure 19B:
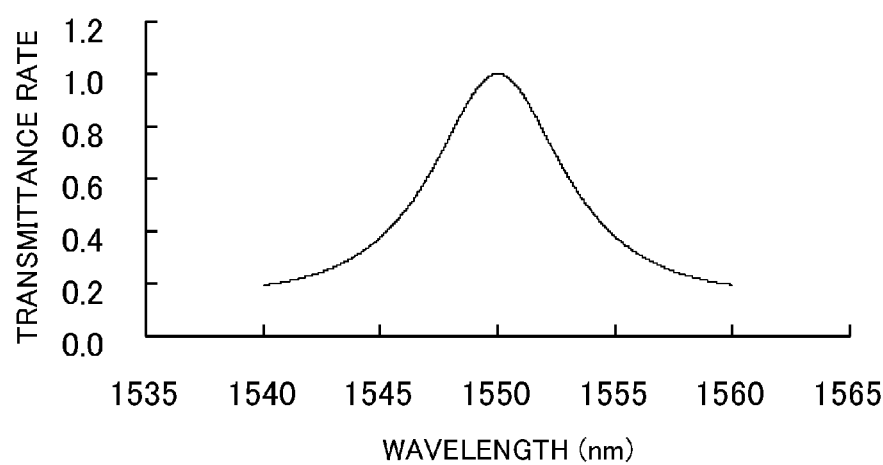

In particular, as shown in FIG. 18, the present tunable laser module 1 includes, in the inside of a cavity formed from two reflecting mirrors 6 and 7, a semiconductor optical amplifier (SOA) 8 which is a gain medium, one wavelength filter (here, Fabry Perrot etalon filter; internal etalon) 10 having a periodic peak wavelength [periodic wavelength characteristic; peak wavelength period $\Delta\lambda 1$; refer to FIG. 19A], and one tunable filter (transmission type tunable filter) 40 having a transmission characteristic (transmission peak wavelength) having one peak wavelength and having a transmission wavelength (transmission peak wavelength) which can be continuously varied over a wide range (wide band). The tunable laser module 1 is formed including the tunable laser section 2B wherein one of peak wavelengths of the wavelength filter 10 is selected by the tunable filter 40 to vary the oscillation wavelength.

In the tunable laser section 2B having such a configuration as described above, by varying the position (transmission wavelength band) of the peak wavelength of the transmission characteristic of the tunable filter 40, the oscillation wavelength can be varied discontinuously at a wavelength interval corresponding to the interval (period $\Delta\lambda 1$) of the peak wavelength of the wavelength filter 10 [refer to FIGS. 21A to 21D].

Here, the internal etalon 10 is formed from a thin plate formed, for example, silicon (Si) similarly as in the case of the first embodiment described hereinabove. In the present embodiment, the thickness of the internal etalon 10 is adjusted such that the period (FSR) $\Delta\lambda 1$ of the transmission peak wavelength may be 1.8 nm.

The tunable filter 40 is a filter for selecting one of a plurality of peak wavelengths of the wavelength filter (here, internal etalon) 10 having a periodic peak wavelength.

As this tunable filter 40, for example, an acousto-optic tunable filter (AOTP) is used wherein the position of a transmission peak wavelength varies in response to the frequency of a high frequency electric signal applied thereto (for example, the transmission wavelength shifts to the shorter wavelength side as the frequency becomes higher).

Further, the temperature (wavelength controlling parameter) of the internal etalon 10 is controlled by the controller 5 similarly as in the case of the first embodiment described hereinabove, and the position of a transmission peak wavelength can be varied by the temperature control. To this end, a heater (wavelength controlling element; temperature adjustment mechanism) 12 for controlling the temperature (wavelength controlling parameter) is provided in the internal etalon 10. The heater 12 is controlled based on a wavelength controlling signal from the controller 5.

Further, where an acousto-optic tunable filter is used as the tunable filter 40, the frequency (application frequency; wavelength controlling parameter) of a high frequency electric signal to be applied to the acousto-optic tunable filter 40 is controlled by the controller 5, and the position of the transmission peak wavelength can be varied by this application frequency control. To this end, electrodes for applying the high frequency electric signal are provided for the acousto-optic tunable filter 40. The frequency of the high frequency electric signal to be applied to the electrodes is controlled by the controller 5.

Further, in the present embodiment, an oscillation frequency is selected by the internal etalon 10 and the tunable filter 40 configured in such a manner as described above.

Figure 20:
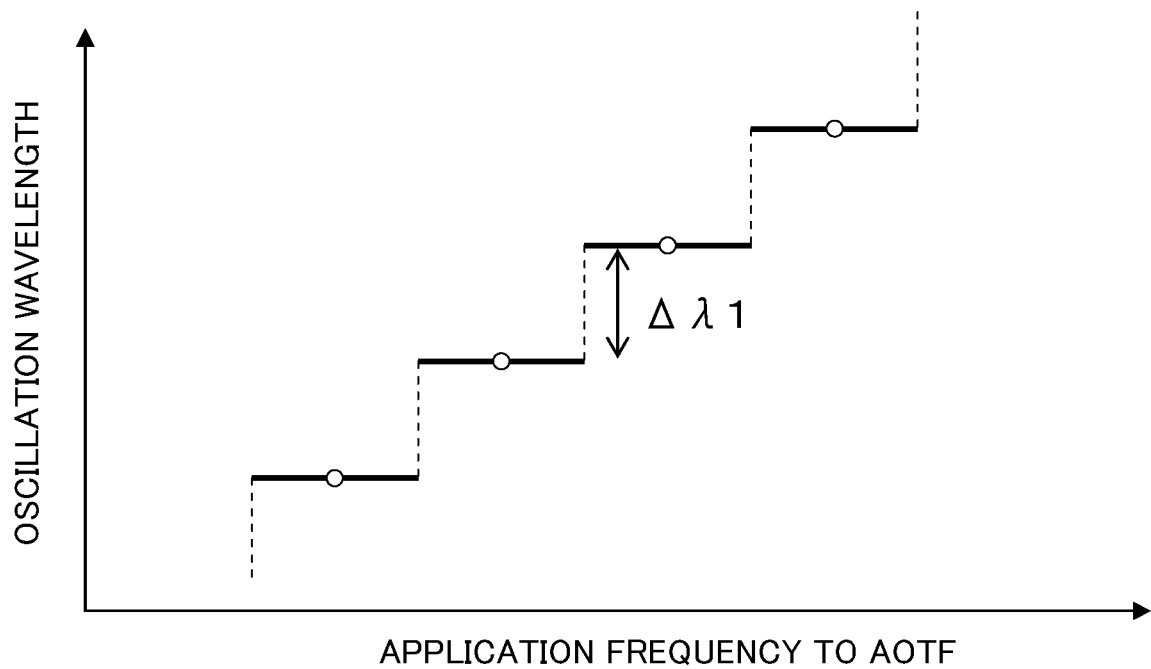
FIG. 20 is a view illustrating variation of the oscillation wavelength where the application frequency to the tunable filter of a tunable laser section provided in the tunable laser module according to the third embodiment is varied.
Figure 21A:
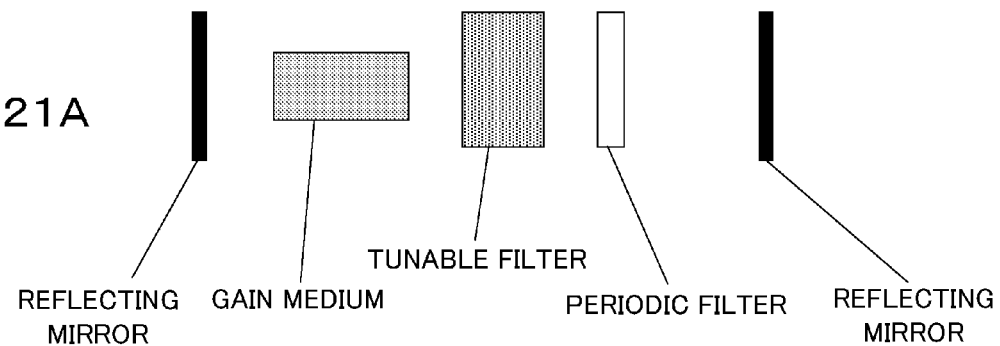
FIGS. 21A to 21D are views illustrating selection of an oscillation wavelength in the tunable laser section provided in the tunable laser module according to the third embodiment, and particularly.
Figure 21B:
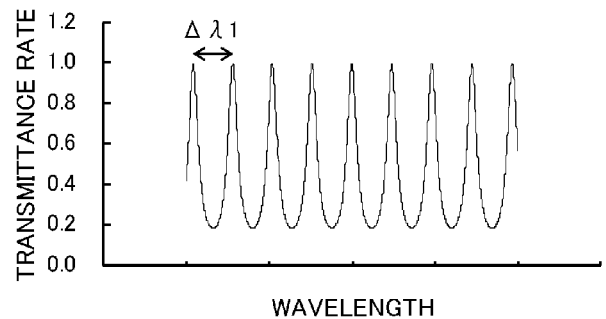
Figure 21C:
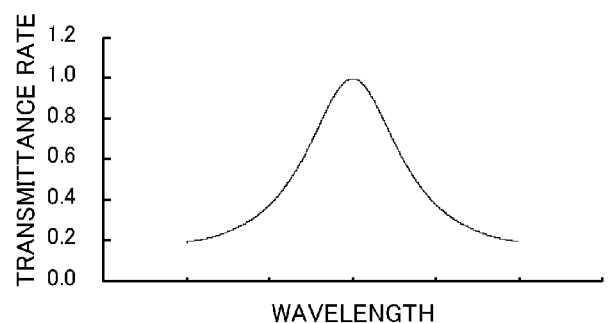
Figure 21D:
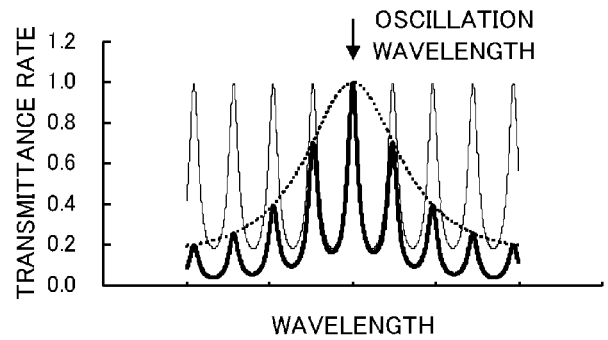
Figure 22:
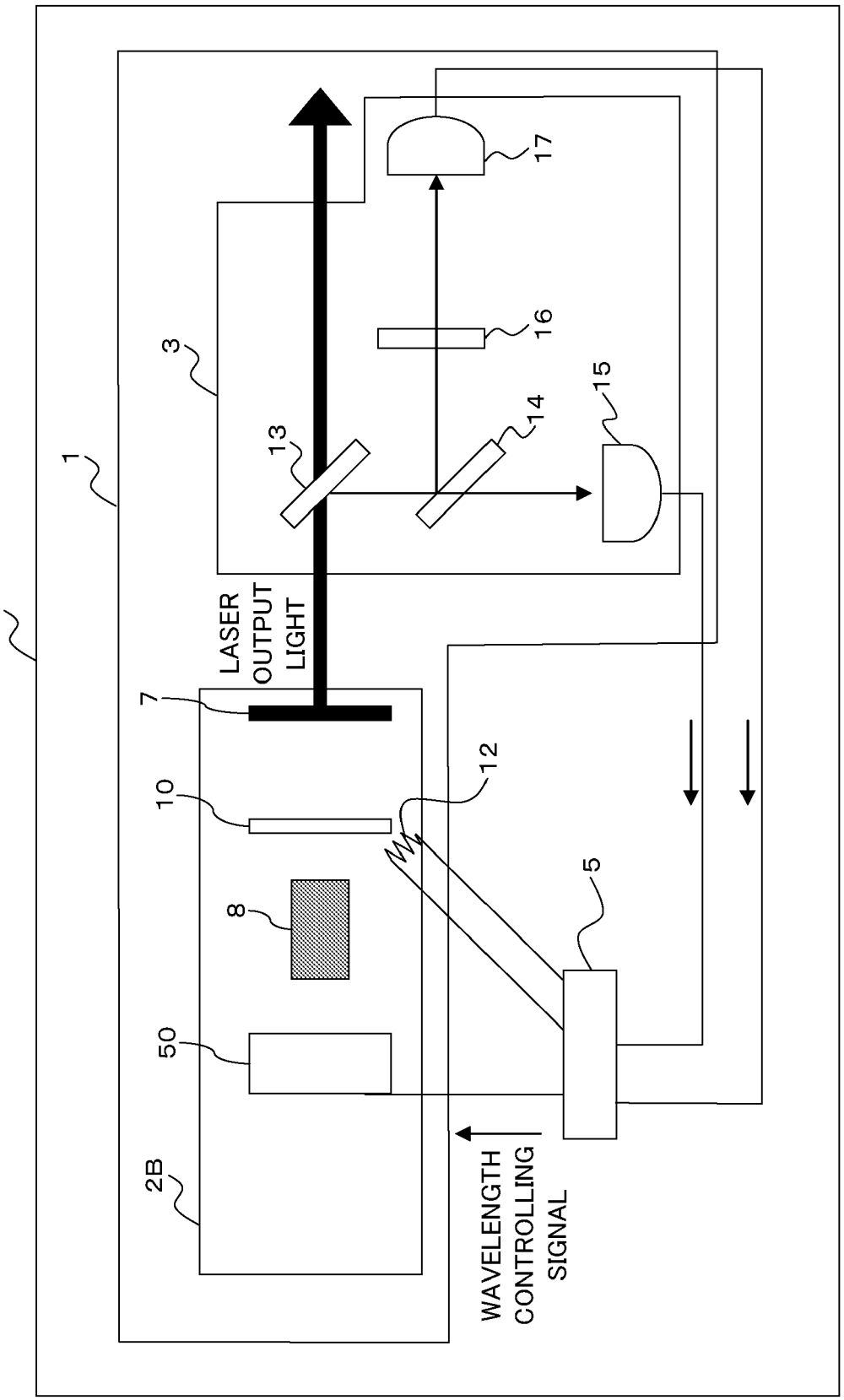
FIG. 22 is a schematic view illustrating a configuration of a tunable laser module according to a modification to the third embodiment.

Here, an oscillation frequency is selected by fixing the position of a peak wavelength of the internal etalon 10 and varying the frequency of the high frequency electric signal to be applied to the tunable filter 40 to vary the position of the transmission peak wavelength of the tunable filter 40 [refer to FIGS. 21A to 21D]. Consequently, the oscillation wavelength varies stepwise as seen in FIG. 20, and discontinuous variation of the oscillation wavelength occurs at a wavelength interval corresponding to the interval $\Delta\lambda 1$ of the peak wavelength of the internal etalon 10 as illustrated in FIG. 20. Therefore, the internal etalon 10 has a periodic characteristic which gives rise to discontinuous variation of the oscillation wavelength. In other words, the internal etalon 10 has a periodic characteristic which gives rise to discontinuous variation of the optical wavelength in response to continuous variation of the wavelength controlling parameter of tunable filter 40.

Where control of the oscillation wavelength is to be carried out actually, control of adjusting a peak wavelength of the internal etalon 10 having a periodic peak wavelength to a desired ITU-T grid should be carried out. Then, by carrying out control of varying the position of the transmission peak wavelength of the tunable filter 40, the peak wavelength of the internal etalon 10, which complies with the desired ITU-T grid, and the transmission peak wavelength of the tunable filter 40 may be made coincide with each other to select an oscillation wavelength.

It is to be noted here that, although the peak wavelength of the internal etalon 10 is adjusted to a desired ITU-T grid first and then the peak wavelength of the internal etalon 10 and the transmission peak wavelength of the tunable filter 40 are made coincide with each other to select an oscillation wavelength, the adjustment is not limited to this, but, for example, the peak wavelength of the internal etalon 10 and the transmission peak wavelength of the tunable filter 40 may be made coincide with each other to select an oscillation wavelength first, whereafter the oscillation wavelength is adjusted to the ITU-T grid.

Figure 19C:
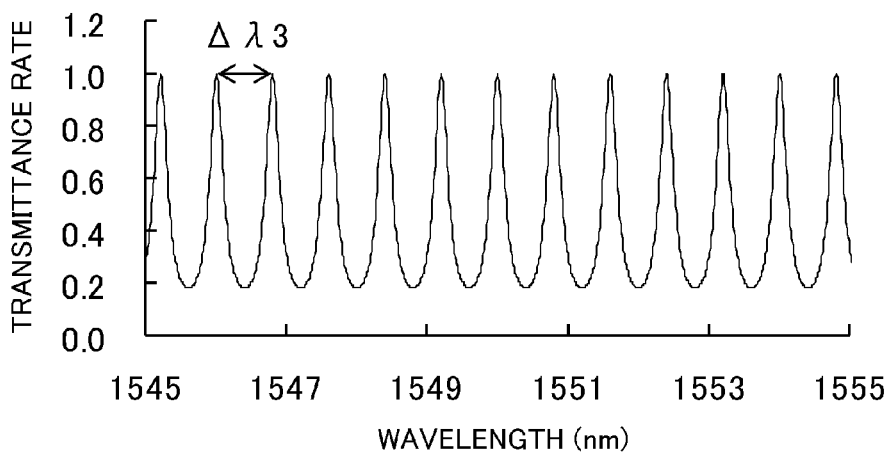

It is to be noted that, since the configuration of the wavelength locker 3 provided outside the tunable laser section 2B (outside the cavity) is same as that in the first embodiment, description of the same is omitted here. It is to be noted that FIG. 19C illustrates a transmission spectrum of the external etalon 16 and a period $\Delta\lambda 3$ (0.8 nm) of the transmission peak wavelength.

Incidentally, in order for a wavelength locker signal to vary discontinuously with certainty at a discontinuous point of the oscillation wavelength, the period of the internal etalon 10 should be set so as to be equal to N+0.15 to N+0.35 times or N+0.65 to N+0.85 times (N is an integer equal to or greater than 0) the period of the external etalon 16 similarly as in the case of the first embodiment described hereinabove.

In particular, the internal etalon 10 should be set so as to have a period equal to 2.25 times the period of the external etalon 16 (peak interval; $\Delta\lambda 1=1.8$ nm). By this, when discontinuous wavelength variation occurs, the wavelength locker signal varies discontinuously with certainty, and a discontinuous point of the oscillation wavelength can be detected with certainty using the wavelength locker. Then, based on this, it is possible to optimize the operating point of the acousto-optic tunable filter 40 (operating point of the tunable laser section 2B), that is, the frequency (wavelength controlling signal; wavelength controlling parameter) of the electric signal to be applied.

It is to be noted that the configuration of the other part is similar to that of the first embodiment described hereinabove, and therefore, description of the same is omitted here.

Accordingly, with the tunable laser module, tunable laser apparatus and controlling method for a tunable laser according to the present embodiment, similarly as in the case of the first embodiment described hereinabove, there is an advantage that it is possible to detect a discontinuous point at which the oscillation wavelength varies discontinuously without complicating the configuration of the tunable laser module 1 and set or update the operating point with certainty avoiding the discontinuous point and points in the proximity of the discontinuous point, and stabilized single mode oscillation can be implemented.

It is to be noted that, while, in the embodiment described above, a case wherein an acousto-optical tunable filter is used as a tunable filter is taken as an example, the tunable filter is not limited to this, but a different tunable filter may be used. Also in this instance, effects similar to those in the embodiment described above are achieved. For example, a reflection filter of the liquid crystal diffraction grating type may be used (for example, refer to Photonics Technology Letters, IEEE, Volume 19, Issue 19, Oct. 1, 2007, pages: 1457-1459, the entire of content of which is incorporated herein by reference). In this instance, a tunable filter (reflection type filter) 50 of the reflection type may serve also as one of two reflecting mirrors which form a cavity. It is to be noted that, in FIG. 22, like elements to those of the embodiment described hereinabove (refer to FIG. 18) are denoted by like reference numerals.

[Others]

It is to be noted that the present invention is not limited to the configurations of the embodiments and the modifications to them described hereinabove but can be modified in various forms without departing from the spirit and the scope of the present invention.

For example, while, in the embodiments and the modifications described hereinabove, two wavelength filters are provided in the inside of a laser cavity, the present invention is not limited to this, but one or more additional wavelength filters may be provided in addition to the two wavelength filters. For example, in the configuration of the first embodiment described hereinabove, in order to implement more stabilized single mode oscillation, a third wavelength filter having a periodic characteristic different from those of the first and second wavelength filters may be provided. Further, for example, in the third embodiment described hereinabove, a plurality of tunable filters may be provided in order to make a peak of the transmission characteristic (or the reflection characteristic) of the tunable filter steeper.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A tunable laser module, comprising:
   a tunable laser section including a gain medium and a wavelength filter having a periodic characteristic which brings about a discontinuous variation of an oscillation wavelength; and
   a monitoring section adapted to output a monitoring signal which periodically varies in response to the oscillation wavelength of the tunable laser section; and wherein
   the monitoring section includes a monitoring wavelength filter having a periodic characteristic which defines the monitoring signal; and
   a relationship between the period of the wavelength filter and the period of the monitoring wavelength filter is set such that the monitoring signal varies when the oscillation wavelength varies discontinuously.

2. The tunable laser module as claimed in claim 1, wherein the period of the wavelength filter is equal to N+0.15 times to N+0.35 times or N+0.65 times to N+0.85 times the period of the monitoring wavelength filter, N being an integer equal to 0 or more.

3. The tunable laser module as claimed in claim 1, wherein the monitoring section includes:
   an optical detector adapted to detect intensity of light which is part of output light of the tunable laser section and passes through the monitoring wavelength filter; and
   another optical detector adapted to detect light intensity of part of the output light of the tunable laser section.

4. The tunable laser module as claimed in claim 1, wherein the wavelength filter is one of a diffraction grating type wavelength filter, a ring resonator type wavelength filter and a Fabry-Perot etalon filter.

5. The tunable laser module as claimed in claim 1, wherein the tunable laser section includes, in addition to the wavelength filter, a different wavelength filter having a periodic characteristic different from that of the wavelength filter.

6. The tunable laser module as claimed in claim 5, wherein, in a case wherein, when a peak position of the characteristic of the different wavelength filter is varied, continuous wavelength variation occurs in a direction same as that of the discontinuous variation of the oscillation wavelength, where the amount of the continuous wavelength variation is represented by $\Delta\lambda c$ and the period of the monitoring wavelength filter is represented by T1, the period of the wavelength filter is $T1(N+0.15)+\Delta\lambda c$ to $T1(N+0.35)+\Delta\lambda c$ or $T1(N+0.65)+\Delta\lambda c$ to $T1(N+0.85)+\Delta\lambda c$, N being an integer equal to 0 or more.

7. The tunable laser module as claimed in claim 5, wherein, in a case wherein, when a peak position of the characteristic of the different wavelength filter is varied, continuous wavelength variation occurs in a direction opposite to that of the discontinuous variation of the oscillation wavelength, where the amount of the continuous wavelength variation is represented by $\Delta\lambda c$ and the period of the monitoring wavelength filter is represented by T1, the period of the wavelength filter is $T1(N+0.15)-\Delta\lambda c$ to $T1(N+0.35)-\Delta\lambda c$ or $T1(N+0.65)-\Delta\lambda c$ to $T1(N+0.85)-\Delta\lambda c$, N being an integer equal to 0 or more.

8. The tunable laser module as claimed in claim 5, wherein the different wavelength filter is one of a diffraction grating type wavelength filter, a ring resonator type wavelength filter and a Fabry-Perot etalon filter.

9. The tunable laser module as claimed in claim 4, wherein the diffraction grating type wavelength filter is one of a sampled grating type wavelength filter, a sampled grating distribution Bragg reflector type wavelength filter, and a superstructure grating distribution Bragg reflector type wavelength filter.

10. The tunable laser module as claimed in claim 1, wherein the tunable laser section includes a tunable filter in addition to the wavelength filter.

11. The tunable laser module as claimed in claim 10, wherein the tunable filter is a transmission type tunable filter or a reflection type tunable filter.

12. The tunable laser module as claimed in claim 1, wherein the period of the monitoring wavelength filter is equal to an integral multiple of 12.5 GHz, 25 GHz, 50 GHz, or 100 GHz where the period is converted into a frequency.

13. A tunable laser apparatus, comprising:
   a tunable laser module including a tunable laser section which includes a gain medium and a wavelength filter having a periodic characteristic which brings about a discontinuous variation of an oscillation wavelength, and a monitoring section adapted to output a monitoring signal which periodically varies in response to the oscillation wavelength of the tunable laser section; and
   a controller adapted to control the tunable laser section based on the monitoring signal from the monitoring section; and wherein
   the monitoring section includes a monitoring wavelength filter having a periodic characteristic which defines the monitoring signal; and
   a relationship between the period of the wavelength filter and the period of the monitoring wavelength filter of the monitoring section is set such that the monitoring signal varies when the oscillation wavelength varies discontinuously.

14. The tunable laser apparatus as claimed in claim 13, wherein the controller is configured so as to detect a discontinuous point of the monitoring signal by varying a wavelength controlling signal for the tunable laser section and set an operating point of the tunable laser section based on the discontinuous point of the monitoring signal.

15. The tunable laser apparatus as claimed in claim 13, further comprising a wavelength controlling device adapted to vary a wavelength controlling parameter for the tunable laser section; and wherein
   the wavelength controlling device is controlled based on a wavelength controlling signal from the controller.

16. The tunable laser apparatus as claimed in claim 15, wherein the wavelength controlling device is a Peltier element or a heater.

17. The tunable laser apparatus as claimed in claim 15, wherein the wavelength controlling device is a heater and a Peltier element.

18. A controlling method for a tunable laser, comprising:
   varying an oscillation wavelength of a tunable laser including a wavelength filter having a periodic characteristic which brings about a discontinuous variation of the oscillation wavelength;
   detecting a discontinuous point of a monitoring signal obtained in response to the oscillation wavelength of the tunable laser through a monitoring wavelength filter set such that, when the oscillation wavelength varies discontinuously in relation with the period of the wavelength filter, the monitoring signal varies; and
   setting an operating point of the tunable laser based on the discontinuous point of the monitoring signal.

19. The controlling method for a tunable laser as claimed in claim 18, further comprising:
   varying the oscillation wavelength of the tunable laser to the longer wavelength side;

detecting the discontinuous point on the longer wavelength side of the monitoring signal corresponding to the oscillation wavelength of the tunable laser;

varying the oscillation wavelength of the tunable laser to the shorter wavelength side;

detecting the discontinuous point on the shorter wavelength side of the monitoring signal corresponding to the oscillation wavelength of the tunable laser; and setting the operating point of the tunable laser at a middle point between the discontinuous point on the longer wavelength side and the discontinuous point on the shorter wavelength side.

20. The controlling method for a tunable laser as claimed in claim 19, wherein the discontinuous point of the monitoring signal is detected depending upon whether or not a variation amount of the monitoring signal where a wavelength controlling parameter is varied by a fixed amount is equal to and greater than a threshold value set in advance.

* * * * *